United States Patent
Hsieh et al.

(10) Patent No.: US 11,810,933 B2
(45) Date of Patent: Nov. 7, 2023

(54) IMAGE SENSOR DEVICE AND FABRICATION METHOD THEREOF

(71) Applicant: TAIWAN SEMICONDUCTOR MANUFACTURING CO., LTD., Hsinchu (TW)

(72) Inventors: Feng-Chien Hsieh, Pingtung (TW); Yun-Wei Cheng, Taipei (TW); Wei-Li Hu, Tainan (TW); Kuo-Cheng Lee, Tainan (TW); Ying-Hao Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 74 days.

(21) Appl. No.: 17/010,717

(22) Filed: Sep. 2, 2020

(65) Prior Publication Data
US 2021/0225916 A1    Jul. 22, 2021

Related U.S. Application Data

(60) Provisional application No. 62/963,913, filed on Jan. 21, 2020.

(51) Int. Cl.
*H01L 27/146* (2006.01)

(52) U.S. Cl.
CPC .. *H01L 27/14623* (2013.01); *H01L 27/14683* (2013.01)

(58) Field of Classification Search
CPC ............ H01L 27/14685; H01L 27/14623
See application file for complete search history.

(56) References Cited

U.S. PATENT DOCUMENTS

| | | | | |
|---|---|---|---|---|
| 8,558,947 | B2 * | 10/2013 | Enomoto | H01L 27/1464 |
| | | | | 348/374 |
| 9,232,162 | B2 * | 1/2016 | Lenchenkov | H01L 27/1464 |
| 10,804,304 | B2 * | 10/2020 | Noh | H01L 27/1463 |
| 11,362,122 | B2 * | 6/2022 | Nishikido | H01L 27/14623 |
| 2010/0225774 | A1 * | 9/2010 | Enomoto | H01L 27/1464 |
| | | | | 348/222.1 |
| 2013/0113968 | A1 * | 5/2013 | Lenchenkov | H04N 5/361 |
| | | | | 257/447 |
| 2019/0096951 | A1 | 3/2019 | Cheng et al. | |
| 2019/0221597 | A1 * | 7/2019 | Noh | H01L 27/14605 |
| 2020/0127030 | A1 * | 4/2020 | Ogawa | H01L 27/14623 |
| 2020/0161353 | A1 * | 5/2020 | Wang | H01L 27/1463 |

(Continued)

FOREIGN PATENT DOCUMENTS

| TW | 200623439 A | 7/2006 |
|---|---|---|
| TW | 200913247 A | 3/2009 |

(Continued)

*Primary Examiner* — Mounir S Amer
*Assistant Examiner* — Alexander Belousov
(74) *Attorney, Agent, or Firm* — Maschoff Brennan

(57) ABSTRACT

A method for fabricating an image sensor device is provided. The method includes forming a plurality of photosensitive pixels in a substrate; depositing a dielectric layer over the substrate; etching the dielectric layer, resulting in a first trench in the dielectric layer and laterally surrounding the photosensitive pixels; and forming a light blocking structure in the first trench, such that the light blocking structure laterally surrounds the photosensitive pixels.

20 Claims, 31 Drawing Sheets

(56) References Cited

U.S. PATENT DOCUMENTS

| | | | |
|---|---|---|---|
| 2020/0286939 A1 | 9/2020 | Hsu | |
| 2020/0357754 A1* | 11/2020 | Toyoshima | ............... G01J 1/42 |
| 2021/0343770 A1* | 11/2021 | Nishikido | ......... H01L 27/14621 |

FOREIGN PATENT DOCUMENTS

| | | |
|---|---|---|
| TW | 201916389 A | 4/2019 |
| TW | 201924036 A | 6/2019 |

\* cited by examiner

IMAGE SENSOR DEVICE AND FABRICATION METHOD THEREOF

PRIORITY CLAIM AND CROSS-REFERENCE

This application claims priority to U.S. Provisional Application Ser. No. 62/963,913, filed Jan. 21, 2020, which is herein incorporated by reference.

BACKGROUND

Image sensors generate electrical signals in response to the stimulation of photons. The magnitudes of the electrical signals (such as the photo-current) depend on the intensity of the incident light received by the respective image sensors. The image sensors may suffer from non-optically generated signals, which include the leakage signals, thermally generated signals, dark currents, and the like. Accordingly, the electrical signals generated by the image sensors are then calibrated, so that the undesirable signals are cancelled out from the output signals of the image sensors. To cancel the non-optically generated signals, black reference image sensors are formed, and are used to generate non-optically generated signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
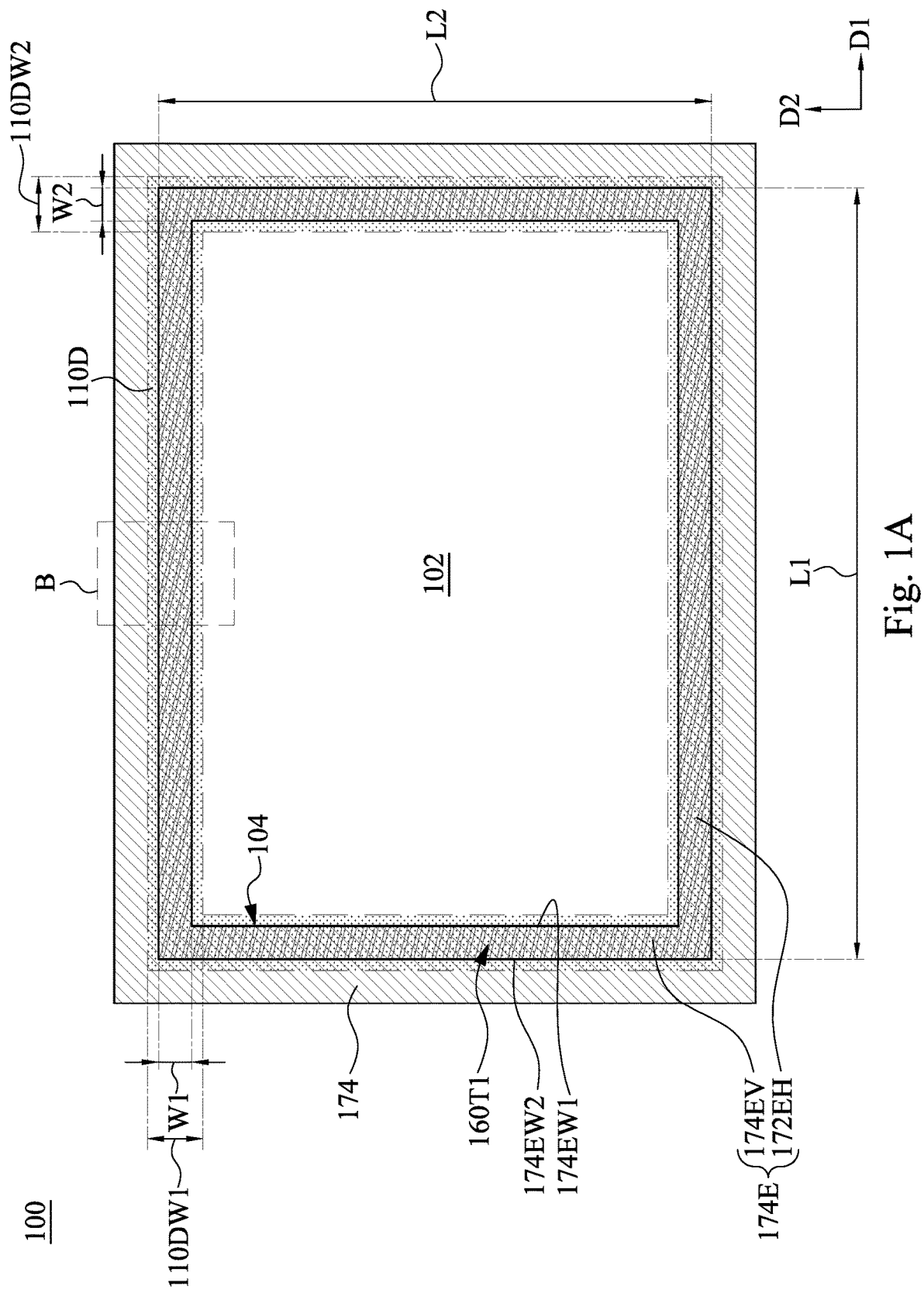
FIG. 1A is a schematic top view of an image sensor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In certain embodiments, the term "about" used in this context means greater or less than the stated value or the stated range of values by a percentage such as 5%, 10%, 15%, etc. of the stated values.

An image sensor device including active image sensors and black reference image sensors and the methods of forming the same are provided in accordance with some embodiments of the present disclosure. The black reference image sensors may be covered by a light blocking element (e.g., a metal shielding layer), thereby being blocked from receiving light signals. In the embodiments of the present disclosure, the light blocking element may have a ring-shaped light blocking structure laterally surrounding a region where the active image sensors are disposed. The ring-shaped light blocking structure may block lateral light, thereby preventing light from laterally propagating into the black reference image sensors. Plural intermediate stages of manufacturing the image sensor device are illustrated. Variations of the embodiments are also discussed. Throughout the various views and illustrative embodiments, like reference numbers are used to designate like elements.

FIG. 1A is a schematic top view of an image sensor device 100 according to some embodiments of the present disclosure. The image sensor device 100 may include a pixel array region 102 and a black level correction (BLC) region 104 laterally surrounding the pixel array region 102. In some embodiments of the present disclosure, a light blocking element 174 is formed in the BLC region 104, thereby shielding the BLC region 104 from incident light. The light blocking element 174 may include a ring-shaped light blocking structure 174E at a position adjacent to the pixel array region 102, thereby avoiding light laterally propagating from the pixel array region 102 towards the BLC region 104. The image sensor device 100 may further include other regions such as, for example, a contact pad (E-pad) region and an alignment region such as a scribe-line primary mark (SPM) region, which are not explicitly illustrated, since their inclusion is not necessary for understanding various embodiments described herein.

Figure 1B:
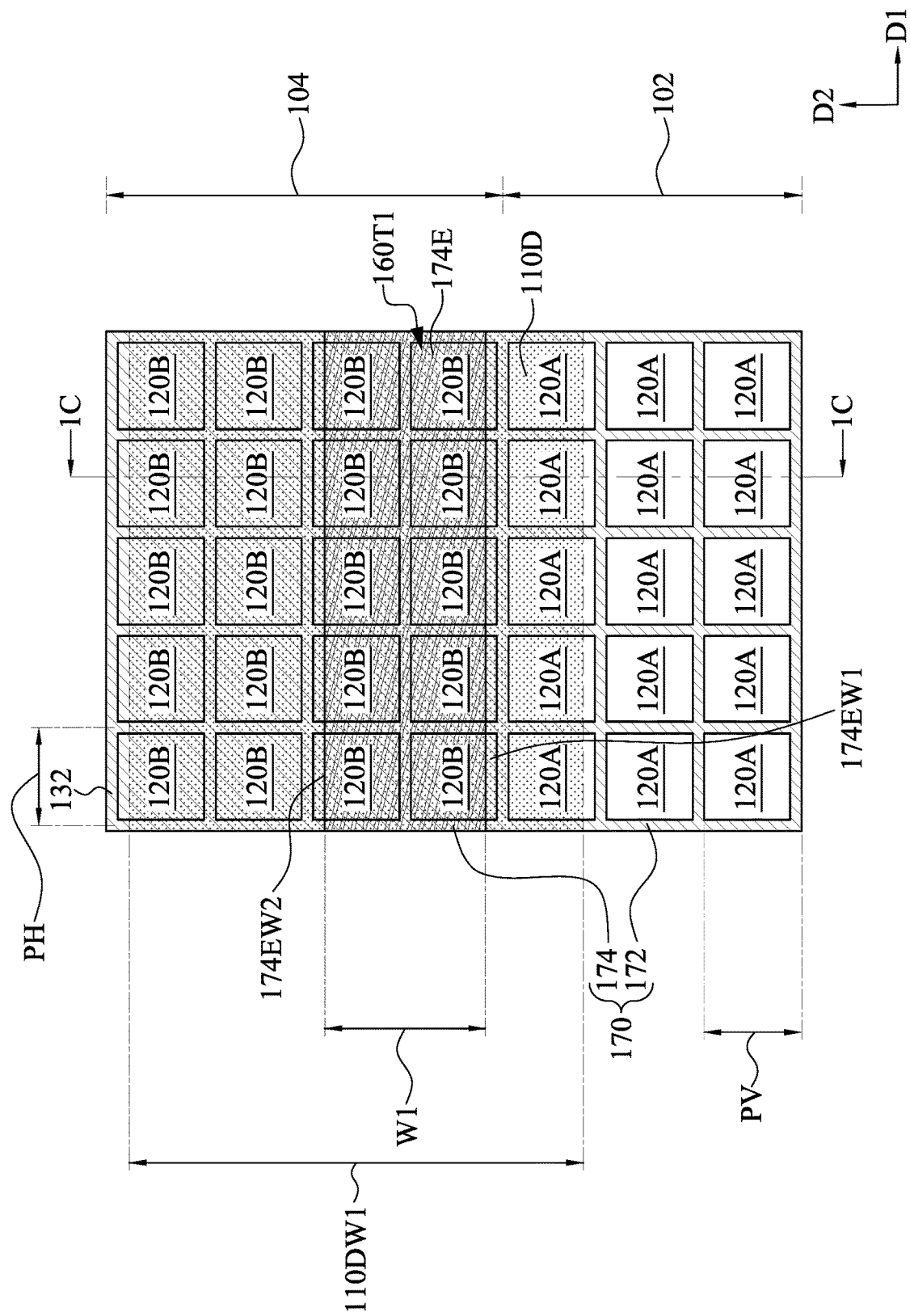
FIG. 1B is an enlarged view of a portion of FIG. 1A.
Figure 1C:
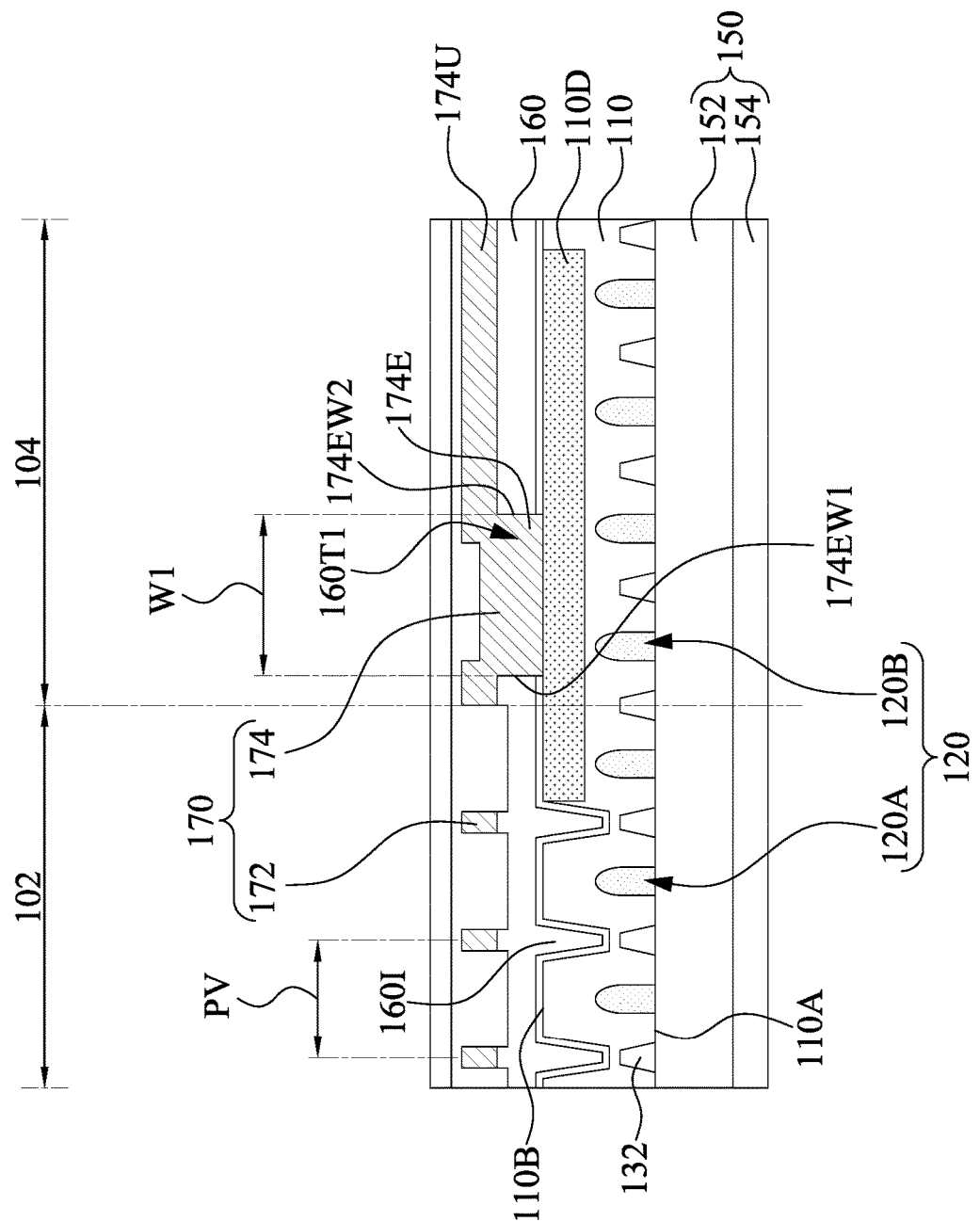
FIG. 1C is a schematic cross-sectional view taken along line C-C in FIG. 1B.

FIG. 1B is an enlarged view of a partial region B of FIG. 1A. FIG. 1C is a schematic cross-sectional view taken along line 1C-1C in FIG. 1B. Reference is made to FIGS. 1A-1C. In some embodiments, the image sensor device 100 includes a substrate 110. A surface 110A may be referred to as a front surface of the substrate 110, and a surface 110B may be referred to as a back surface of the substrate 110. Plural photosensitive pixels 120 (including photosensitive pixels 120A and 120B) are formed in the vicinity of the front surface 110A of the substrate 110. In some embodiments, the pixel array region 102 of the image sensor device 100 includes active photosensitive pixels 120A, which are used for generating electrical signals in response to the sensed light. The BLC region 104 of the image sensor device 100 includes reference photosensitive pixels 120B, which are used for generating reference black level signals. In some embodiments the photosensitive pixels 120A and 120B may be formed simultaneously, and materials of the photosensitive pixels 120A and 120B may be identical to each other. The image sensor device 100 may further include isolation structures 132 between neighboring photosensitive pixels 120 to prevent electrical cross-talk between the photosensitive pixels 120. In some embodiments, the image sensor device 100 further includes an interconnect structure 150 (e.g., including an inter-layer dielectric (ILD) layer 152 and/or inter-metal dielectric (IMD) layers 154 and multi-level interconnects within the ILD layer 152 and the IMD layers 154) over the front surface of the substrate 110, thereby forming electrical circuits with the photosensitive pixels 120.

In some embodiments, the image sensor device 100 may include a dielectric layer 160 over the back surface 110B of the substrate 110. The dielectric layer 160 may extend into trenches formed in the back surface 110B of the substrate 110, thereby forming the isolation structures 1601 between neighboring photosensitive pixels 120A to prevent electrical cross-talk between the photosensitive pixels 120A. The isolation structures 1601 may be referred to as backside deep trench isolation (BDTI) structures. In some embodiments, the dielectric layer 160 may include at least one trench 160T1 laterally surrounding the pixel array region 102. For example, in the present embodiments, the trench 160T1 may encircle the pixel array region 102.

In some embodiments, the image sensor device 100 may include a light blocking layer 170. The light blocking layer 170 is made of a reflective metal material or a light absorption material. For example, the light blocking layer 170 may include suitable metal material, such as Cu, Au, Ag, Al, Ni, W, alloys thereof, or the like. The light blocking layer 170 has a light blocking grid 172 in the pixel array region 102 and a light blocking element 174 in the BLC region 104. The light blocking grid 172 may prevent optical cross-talks between neighboring photosensitive pixels 120A. The light blocking element 174 may cover the photosensitive pixels 120B. For example, the light blocking element 174 may have a portion 174U over an entire top surface of the dielectric layer 160 in the BLC region 104.

In some embodiments of the present disclosure, the light blocking element 174 has an elongated light blocking structure 174E in the trench 160T1 of the dielectric layer 160. The elongated light blocking structure 174E continuously extends around the pixel array region 102 and thus has a ring shape or a closed-loop shape as illustrated in FIG. 1A. Through the configuration, the photosensitive pixels 120B in the BLC region 104 can generate non-optically generated signals (i.e., signals independent of lights received in the pixel array region). For example, as shown in FIG. 1A, the elongated light blocking structures 174E has two short side portions 174EV and two long side portions 174EH connected between the short side portions 174EV to form a ring-shaped structure or closed-loop shaped structure from a top view. In some embodiments, the long side portion 174EH may extend in a direction D1 different from an extending direction D2 of the short side portion 174EV. For example, the direction D1 is perpendicular to the direction D2. The two short side portions 174EV and two long side portions 174EH may be located at four sides of the pixel array region 102, respectively, thereby encircling the pixel array region 102 as viewed from top. In other words, the inner wall 174EW1 of the elongated light blocking structure 174E may encircle the pixel array region 102, and the outer wall 174EW2 of the elongated light blocking structure 174E may encircle the inner wall 174EW1 of the elongated light blocking structure 174E as viewed from top.

In some embodiments of the present disclosure, the light blocking structure 174E extends over at least one of the reference photosensitive pixels 120B adjacent to the photosensitive pixels 120A. For example, as shown in FIG. 1B, the light blocking structure 174E is over more than five of the reference photosensitive pixels 120B adjacent to the photosensitive pixels 120A.

In some embodiments of the present disclosure, the long side portions 174EH of the light blocking structure 174E have a length L1 (as illustrated in FIG. 1A) in their extending direction D1, and the length L1 may be greater than a pixel width PH of the photosensitive pixels 120 (as illustrated in FIG. 1B) measured in the direction D1. Similarly, in some embodiments, the short side portions 174EV of the light blocking structure 174E have a length L2 in their extending direction D2 (as illustrated in FIG. 1A), and the length L2 may be greater than a pixel height PV of the photosensitive pixels 120 (as illustrated in FIG. 1B) measured in the direction D2. For example, the long side portions 174EH and the short side portions 174EV may span one or more photosensitive pixels 120B. For example, as shown in FIGS. 1A and 1B, the long side portion 174EH of the elongated light blocking structures 174E spans five photosensitive pixels 120B. In some embodiments, the lengths L1 and L2 of the long side portions 174EH and the short side portions 174EV are respectively greater than a length and a width of the pixel array region 102, thereby encircling the pixel array region 102.

In some embodiments of the present disclosure, the long side portions 174EH may have a width W1 measured in a direction perpendicular to their extending direction D1, and the width W1 may be equal to or greater than the pixel height PV of the photosensitive pixels 120. Similarly, in some embodiments, the short side portions 174EV may have a width W2 measured in the direction D2, and the width W2 may be equal to or greater than the pixel width PH of the photosensitive pixels 120.

In some embodiments, the widths W1 and W2 may be in a range from about 0.1 micrometer to about 500 micrometers, but other ranges are within the scope of various embodiments of the present disclosure. If the widths W1 and W2 are greater than about 500 micrometers, wafer may suffer from an excessive bending issue due to an increased metal area. If the widths W1 and W2 are less than about 0.1 um, the light blocking structure 174E may be unable to block light from the BLC region 104.

In some embodiments, the image sensor device 100 may further include a doped region 110D in the substrate 110. The doped region 110D may be located adjacent to the elongated light blocking structure 174E. For example, the doped region 110D may have a ring shape or a closed loop shape from a top view, so that the doped region 110D can laterally surround the four sides of the pixel array region 102. In some embodiments, widths 110DW1 and 110DW2 of the doped region 110D may be respectively greater than the widths W1 and W2 of the elongated light blocking structure 174E, and lengths of the doped region 110D in the directions D1 and D2 may be respectively greater than the lengths L1 and L2 of the elongated light blocking structure 174E.

Figure 2:
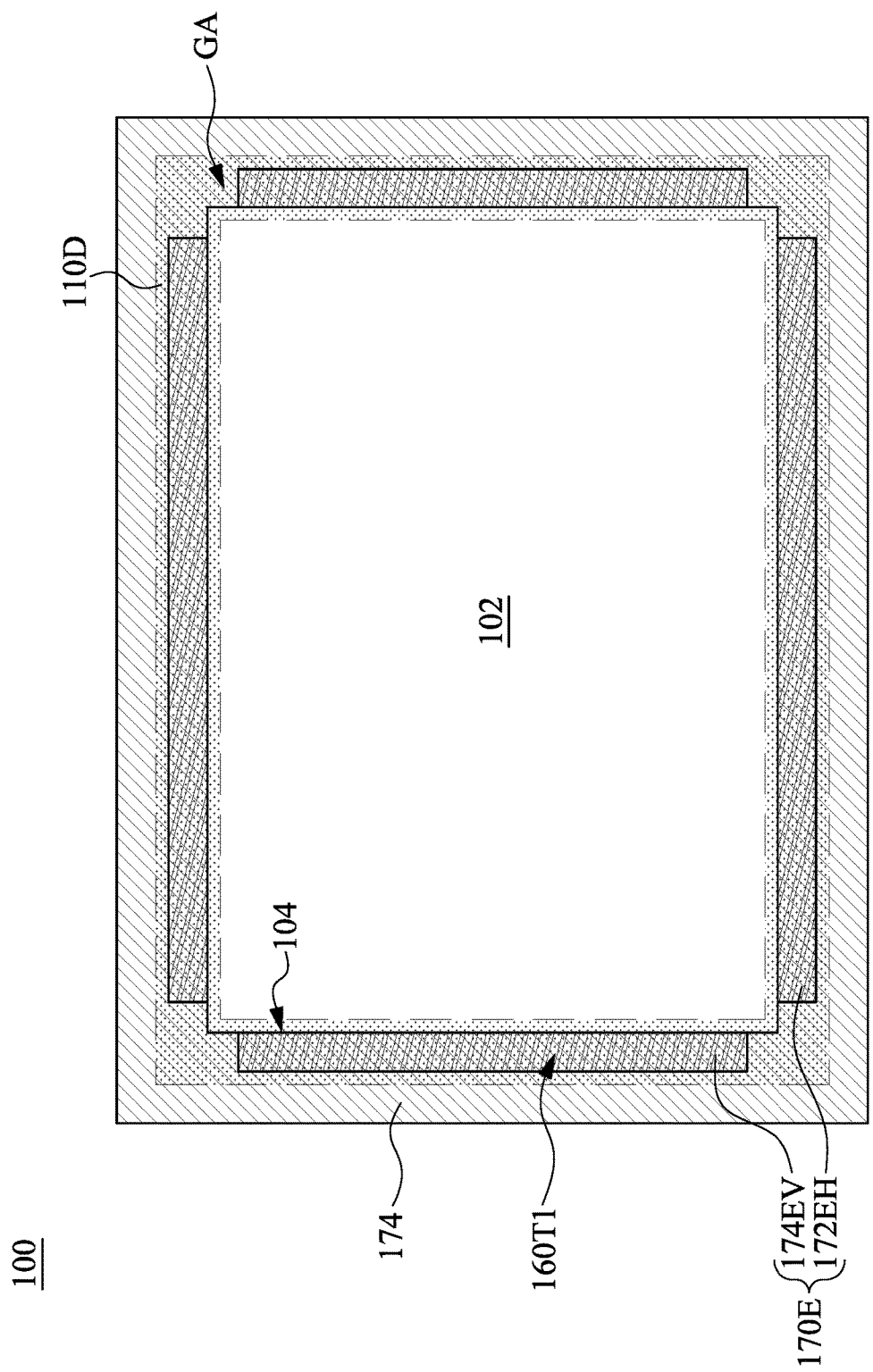
FIG. 2 is a schematic top view of an image sensor device according to some embodiments of the present disclosure.

FIG. 2 is a schematic top view of an image sensor device 100 according to some embodiments of the present disclosure. The present embodiments are similar to the embodiments of FIGS. 1A-1C, except that the elongated light blocking structure 174E does not continuously surround the pixel array region 102. For example, the short side portions 174EV and two long side portions 174EH of the elongated light blocking structure 174E are disconnected from each other, and located adjacent to four sides of the pixel array region 102 as viewed from top. In other words, the short side portions 174EV and long side portions 174EH are separated by gaps GA, which are disposed adjacent to corners of the pixel array region 102 as viewed from top. In the present embodiments, the dielectric layer 160 (referring to FIG. 1C) have plural trenches 160T1 according to the desired configuration of the light blocking structure 174E. For example, the trenches 160T1 in the dielectric layer 160 (referring to FIG. 1C) may be formed adjacent to four sides of the pixel array regions 102, but may not continuously surround the pixel array region 102. Other details of the present embodiments are the same as that discussed previously with respect to FIGS. 1A-1C, and therefore not repeated for the sake of brevity.

Figure 3:
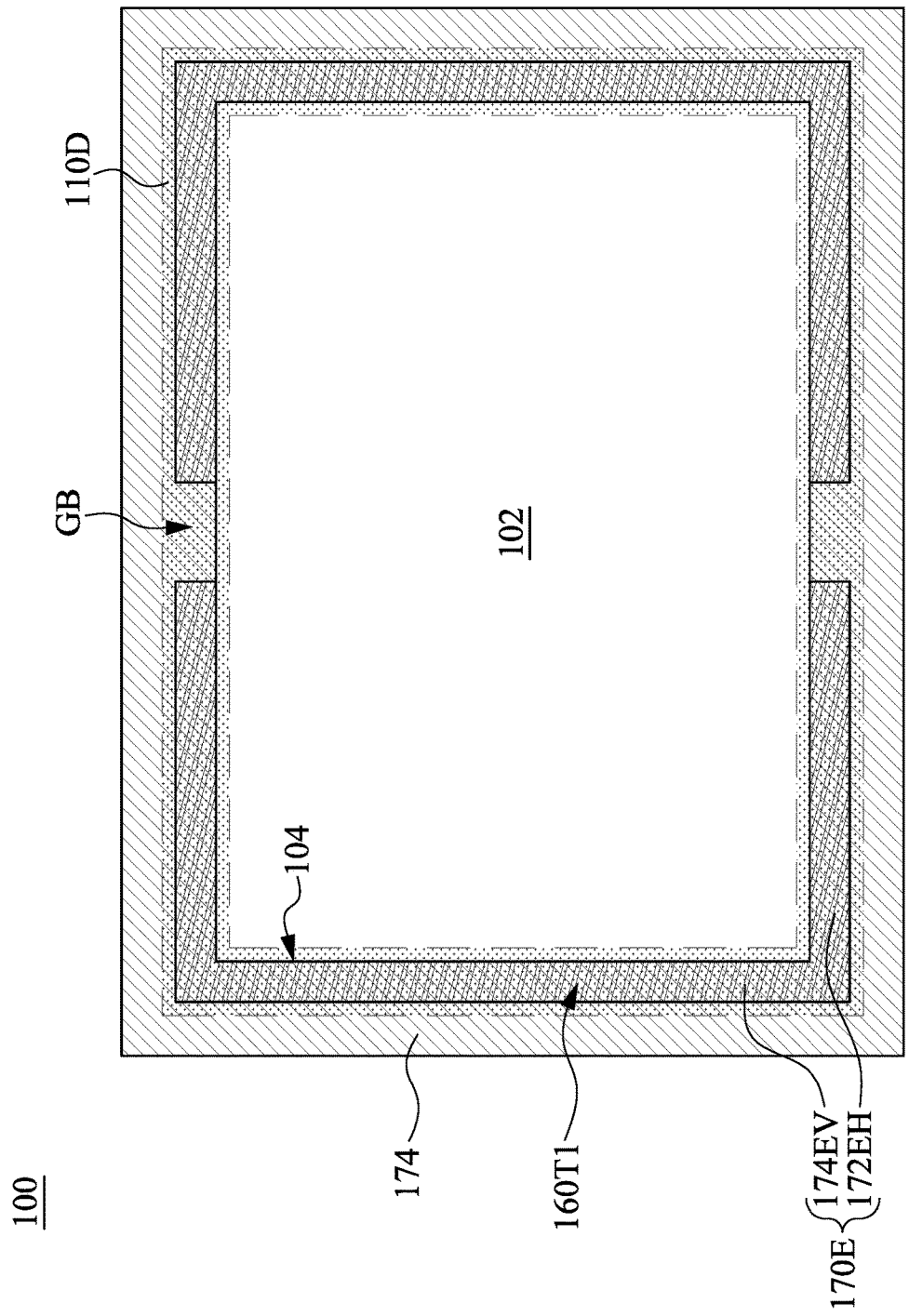
FIG. 3 is a schematic top view of an image sensor device according to some embodiments of the present disclosure.

FIG. 3 is a schematic top view of an image sensor device 100 according to some embodiments of the present disclosure. The present embodiments are similar to the embodiments of FIG. 2, except that the elongated light blocking structure 174E surrounds the corners of the pixel array region 102 as viewed from top, but does not continuously surround the pixel array region 102. For example, one of the short side portions 174EV is connected with at least one of the long side portions 174EH, thereby surrounding a corner of the pixel array region 102. In the present embodiments, each of the long side portions 174EH is broken into discontinuous segments by a gap GB. In some other embodiments, the short side portions 174EV may also be broken into discontinuous segments by gaps GB. In the present embodiments, the dielectric layer 160 (referring to FIG. 1C) has trenches 160T1 according to the desired configuration of the light blocking structure 174E. For example, the trenches 160T1 may surround the corners of the pixel array region 102 as viewed from top, but does not continuously surround the pixel array region 102. Other details of the present embodiments are similar to that discussed previously with respect to FIGS. 1A-1C, and therefore not repeated for the sake of brevity.

Figure 4:
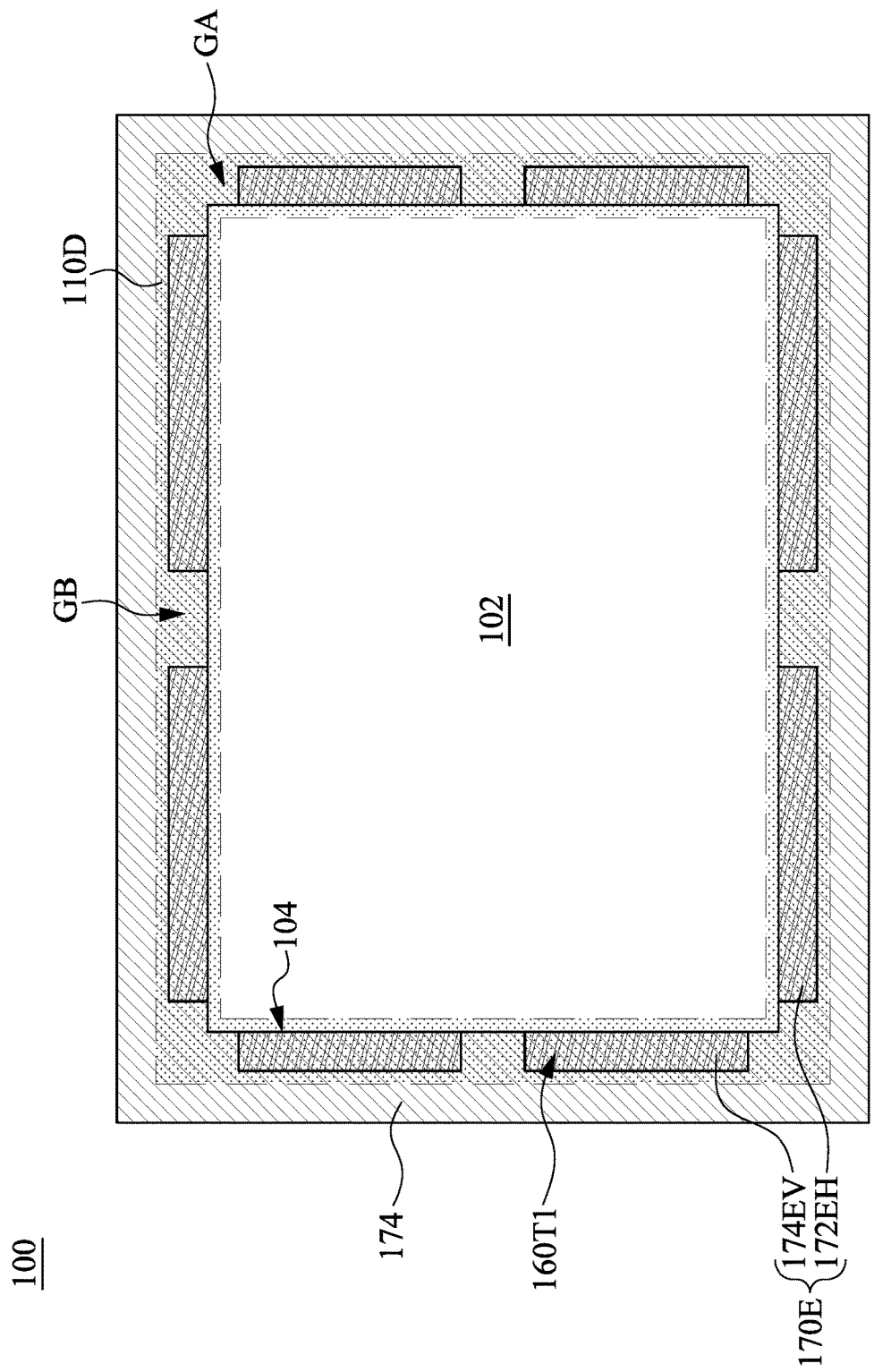
FIG. 4 is a schematic top view of an image sensor device according to some embodiments of the present disclosure.

FIG. 4 is a schematic top view of an image sensor device 100 according to some embodiments of the present disclosure. The present embodiments are similar to the embodiments of FIG. 3, except that the elongated light blocking structure 174E does not surrounds the corners of the pixel array region 102 as viewed from top. The short side portions 174EV and the long side portions 174EH may be separated by gaps GA, and both the short side portions 174EV and the long side portions 174EH are broken into discontinuous segments by gaps GB. The gaps GA are disposed adjacent to corners of the pixel array region 102 as viewed from top, and the gaps GB are disposed adjacent to long sides and short sides of the pixel array region 102 as viewed from top. In the present embodiments, the dielectric layer 160 (referring to FIG. 1C) has trenches 160T1 according to the desired configuration of the light blocking structure 174E. For example, the trenches 160T1 may not surround the corners of the pixel array region 102 as viewed from top. Other details of the present embodiments are similar to that discussed previously with respect to FIGS. 1A-1C, and therefore not repeated for the sake of brevity.

FIGS. 5-16 illustrate a method for fabricating an image sensor device 100 at various intermediate stages of manufacture according to some embodiments of the present disclosure. For simplicity, some components of the image sensor device 100 are omitted. The illustration is merely exemplary and is not intended to be limiting beyond what is specifically recited in the claims that follow. It is understood that additional operations may be provided before, during, and after the operations shown by FIGS. 5-16, and some of the operations described below can be replaced or eliminated for additional embodiments of the method. The order of the operations/processes may be interchangeable.

The image sensor device 100 may include a pixel array region 102, a black level correction (BLC) region 104, a scribe line region 106, and an alignment mark region 108. The dashed lines in FIGS. 5-16 designate the approximate boundaries between the regions 102-108. The photosensitive pixels 120A are formed in the pixel array region 102. The photosensitive pixels 120B are formed in the BLC region 104, and serve as reference pixels that are used to generate reference black level signals, thereby establishing a baseline of an intensity of light for the image sensor device 100. The scribe line region 106 includes a region that separates one semiconductor die (for example, a semiconductor die that includes the BLC region 104 and the pixel region 102) from an adjacent semiconductor die (not illustrated). The scribe line region 106 will experience a die saw process in a later fabrication process to separate adjacent dies. The scribe line region 106 is cut in such a way that the semiconductor devices in each die are not damaged. The scribe line region 106 may include a region where one or more test bonding pads (not illustrated) will be formed in a later processing stage, so that electrical connections between the image sensor device 100 and outside devices may be established.

Figure 5:
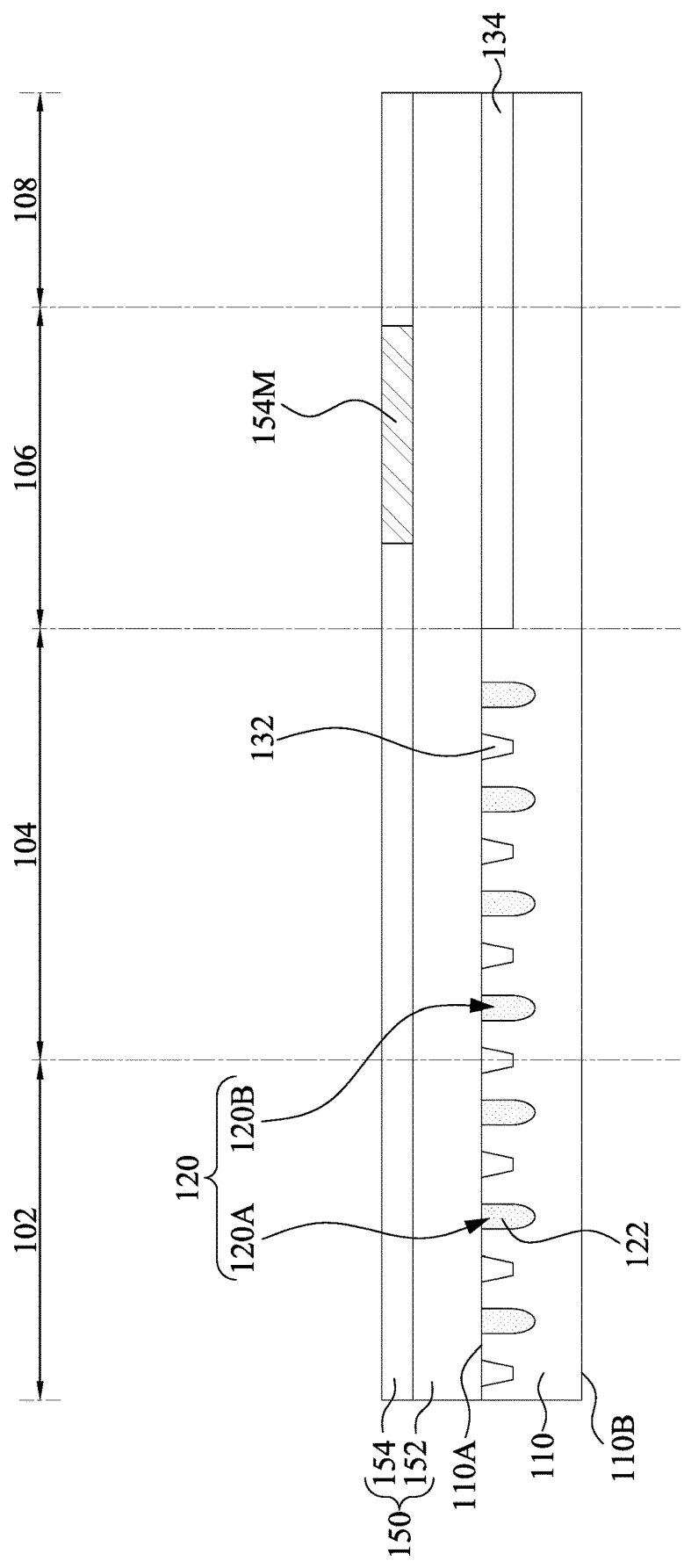
FIGS. 5-16 illustrate a method for fabricating an image sensor device at various intermediate stages of manufacture according to some embodiments of the present disclosure.

Reference is made to FIG. 5. Photosensitive pixels 120 are formed in a substrate 110. The substrate 110 may include, for example, bulk silicon, doped or undoped, or an active layer of a semiconductor-on-insulator (SOI) substrate. Generally, an SOI substrate includes a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 110 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Plural photosensitive pixels 120 (including photosensitive pixels 120A and 120B) are formed at the front surface 110A of the substrate 110. The photosensitive pixels 120 may include respective photosensitive region 122, which may be formed, for example, by implanting suitable impurity ions into the substrate 110 from the front surface 110A of the substrate 110. In some embodiments, the impurity ions may be implanted in an epitaxial layer (not illustrated) within the substrate 110. The photosensitive regions 122 are configured to covert light signals (e.g., photons) to electrical signals, and may be PN junction photo-diodes, PNP photo-transistors, NPN photo-transistors, or the like. For example, the photosensitive regions 122 may include an n-type implantation region formed within a p-type semiconductor layer (e.g., at least a portion of the substrate 110). In such embodiments, the p-type semiconductor layer may isolate and reduce electrical cross-talk between adjacent photoactive regions of the photosensitive pixels 120. In some embodiments, the photosensitive regions 122 may include a p-type implantation region formed within an n-type semiconductor layer (e.g., at least a portion of the substrate 110).

In some embodiments, the photosensitive pixels 120 form a photosensitive pixel array, such as a two-dimensional rectangular array as viewed from top (referring to FIG. 1B). In some embodiments, each photosensitive pixel 120 may further include a transfer gate transistor (not illustrated) and a floating diffusion capacitor (not illustrated). In each photosensitive pixel 120, a first source/drain region of the corresponding transfer gate transistor is electrically coupled to a respective photosensitive region 122, a second source/drain region of the corresponding transfer gate transistor is electrically coupled to a respective floating diffusion capacitor.

Prior to the formation of the photosensitive region 122, isolation structures 132 may be formed at the front surface 110A of the substrate 110. In some embodiments, the isolation structures 132 may include shallow trench isolation (STI) structures. In some embodiments, the STI structures may be formed by patterning the front surface 110A of the substrate 110 to form trenches in the substrate 110 and filling the trenches with suitable dielectric materials to form the STI structures. The dielectric materials may include silicon oxides. In some embodiments, the substrate 110 is patterned using suitable photolithography and etching process. In other embodiments, the isolation structures 132 may include various doped regions formed using suitable implantation processes. In some embodiments, an isolation layer 134 may be formed in the scribe line region 106 and the alignment mark region 108. The isolation layer 134 may be formed simultaneously with the isolation structures 132. In some other embodiments, the isolation structures 132 may be omitted.

An interconnect structure 150 may be formed on the front surface 110A of the substrate 110, thereby forming electrical circuits with the photosensitive pixels 120. The interconnect structure 150 may include an ILD layer 152 and/or IMD layers 154 containing conductive features (e.g., conductive lines and vias comprising copper, aluminum, tungsten, combinations thereof, and the like) formed using any suitable method, such as damascene, dual damascene, or the like. For example, the interconnect structure 150 include a conductive line 154M as shown in the figure. The ILD 152 and IMDs 154 may include low-k dielectric materials having k values, for example, lower than about 4.0 or even 2.0 disposed between such conductive features. In some embodiments, the ILD 152 and IMDs 154 may be made of, for example, phosphosilicate glass (PSG), borophosphosilicate glass (BPSG), fluorosilicate glass (FS G), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), plasma-enhanced CVD (PECVD), or the like.

In some embodiments, prior to the formation of the interconnect structure 150, one or more active and/or passive devices may be formed on the front surface 110A of the substrate 110 in addition to the photosensitive pixels 120 including the photosensitive regions 122, the transfer gate transistors, and the floating diffusion capacitors (not illustrated). The one or more active and/or passive devices may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for illustrative purposes only and are not meant to limit the present disclosure in any manner. Other circuitry may be used as appropriate for a given application.

Figure 6:
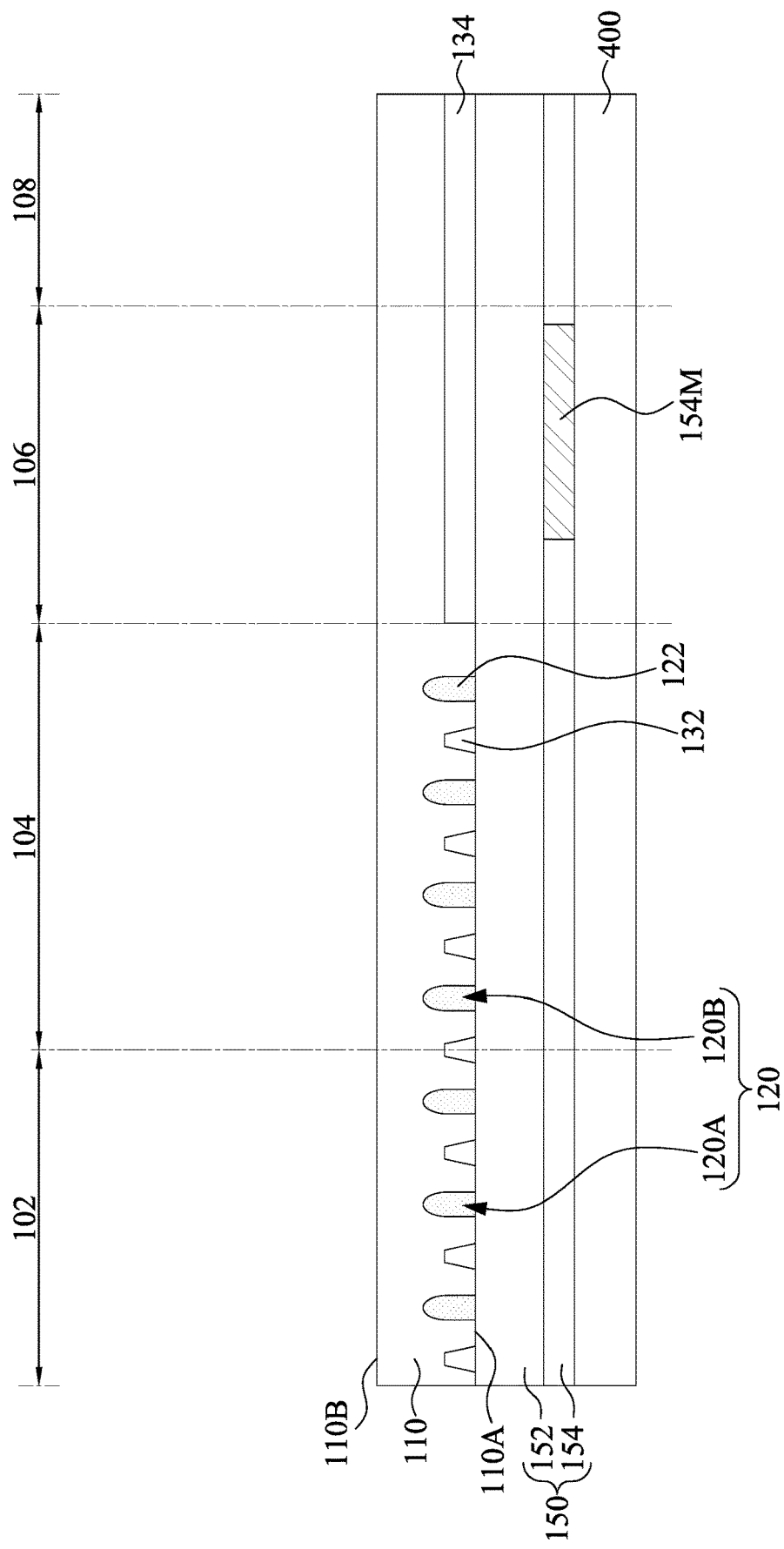

Reference is made to FIG. 6. The structure of FIG. 5 is flipped and optionally bonded to a carrier substrate 400 such that the front surface 110A of the substrate 110 faces the carrier substrate 400 and the back surface 110B of the substrate 110 is exposed for further processing. Various bonding techniques may be employed to achieve bonding between the structure of FIG. 5 and the carrier substrate 400. In some embodiments, the bonding techniques may include for example, a direct bonding process such as metal-to-metal bonding (e.g., copper-to-copper bonding), dielectric-to-dielectric bonding (e.g., oxide-to-oxide bonding), metal-to-dielectric bonding (e.g., oxide-to-copper bonding), hybrid bonding, adhesive bonding, anodic bonding, any combinations thereof and/or the like. In some embodiments, the carrier substrate 400 may provide mechanical support for processing steps performed on the back surface 110B of the substrate 110. In some embodiments, the carrier substrate 400 may be formed of silicon or glass and may be free from electrical circuitry formed thereon. In such embodiments, the carrier substrate 400 provides temporary support and is de-bonded from the image sensor device 100 (referring to FIG. 16) after completing the process steps performed on the back surface 110B of the substrate 110. In other embodiments, the carrier substrate 400 may comprise a semiconductor substrate (not illustrated), one or more active devices (not illustrated) on the semiconductor substrate, and an interconnect structure (not illustrated) over the one or more active devices. In such embodiments, in addition to providing the mechanical support, the carrier substrate 400 may provide additional electrical functionality to the image sensor device depending on design requirements.

After the structure of FIG. 5 is flipped and bonded to the carrier substrate 400, a thinning process may be performed on the back surface 110B of the substrate 110 to thin the substrate 110. In some embodiments, the thinning process serves to allow more light to pass through from the back surface 110B of substrate 110 to the photosensitive regions 122 of the photosensitive pixels 120 without being absorbed by the substrate 110. In some embodiments in which the photosensitive regions 122 are fabricated in an epitaxial layer, the back surface 110B of the substrate 110 may be thinned until the epitaxial layer is exposed. The thinning process may be implemented by using suitable techniques such as grinding, polishing, a SMARTCUT® procedure, an ELTRAN® procedure, and/or chemical etching.

Figure 7:
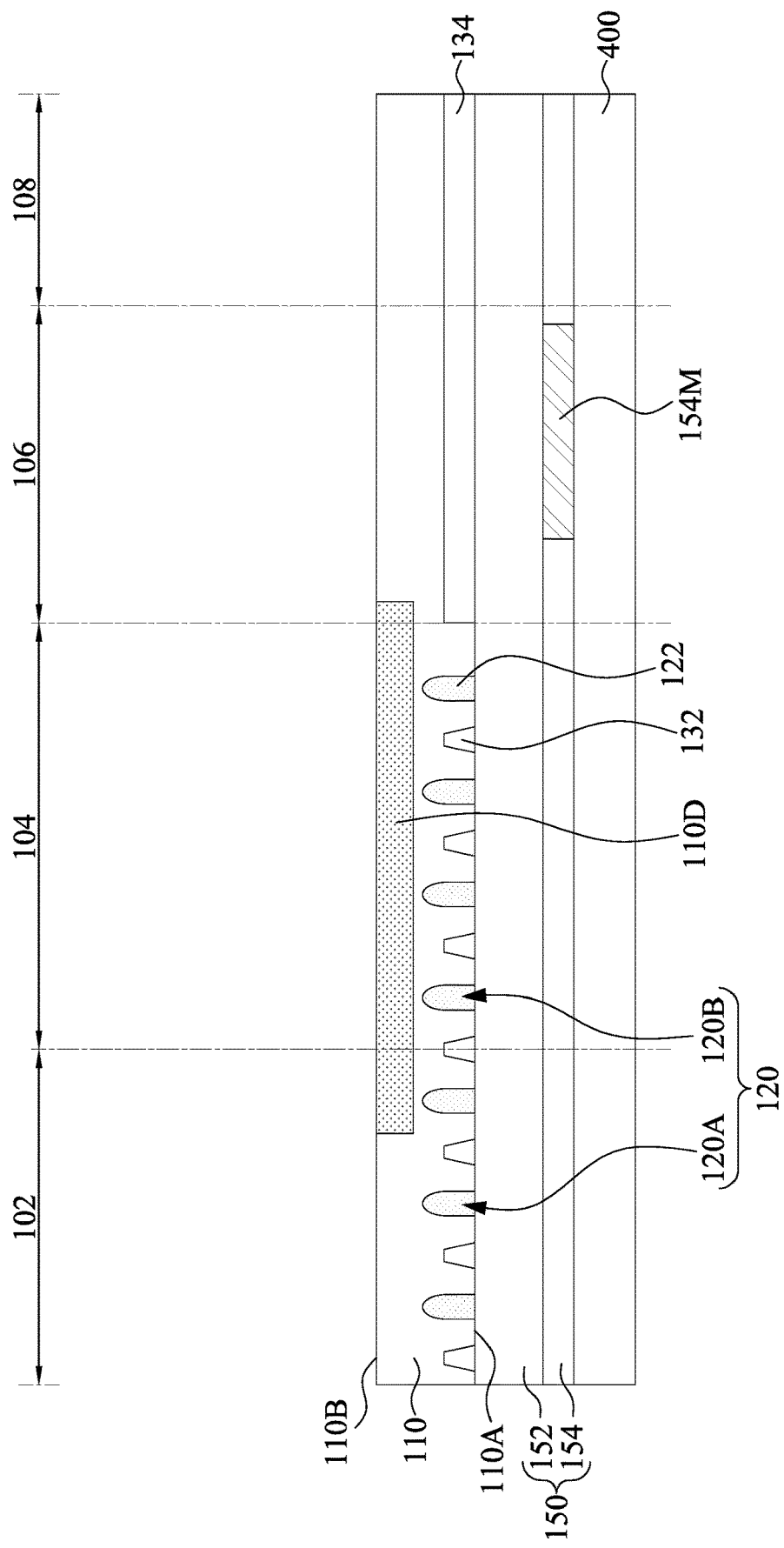

Reference is made to FIG. 7. An ion implantation process is performed on the back surface 110B of the substrate 110 in BLC region 104, thereby forming a doped region 110D in the substrate 110 in BLC region 104. The doped region 110D may be located adjacent to the pixel array region 102. In some embodiments, a patterned mask (e.g., photoresist mask) is formed over the back surface 110B of the substrate 110 to define a desired location of the doped region 110D, the ion implantation process is then performed using the patterned mask as an implantation mask, and the implantation mask is removed (e.g., by using ashing) once the ion implantation is completed. In some embodiments, the doped region 110D is further present in the substrate 110 in the pixel array region 102. In some embodiments where the photosensitive regions 122 are n-type regions formed in a p-type semiconductor layer (e.g., the substrate 110), the doped region 110D are implanted with n-type dopants (e.g., phosphorus). In some embodiments where the photosensitive regions 122 are p-type regions formed in a n-type semiconductor layer (e.g., the substrate 110), the doped region 110D are implanted with p-type dopants (e.g., boron). Stated differently, the doped region 110D and the photosensitive regions 122 are of the same conductivity type. The doped region 110D may have a ring shape or a closed loop shape from a top view as illustrated in FIG. 1A. In some embodiments, the dose of the ion implantation process may be in a range from about 100E2 to about 100E5 atoms/cm$^2$, but other ranges are within the scope of various embodiments of the present disclosure. In some embodiments, the dopant concentration of the doped region 110D is lower than that of the photosensitive regions 122. In some embodiments, the dopant concentration of the doped region 110D is higher than that of the photosensitive regions 122.

Figure 8:
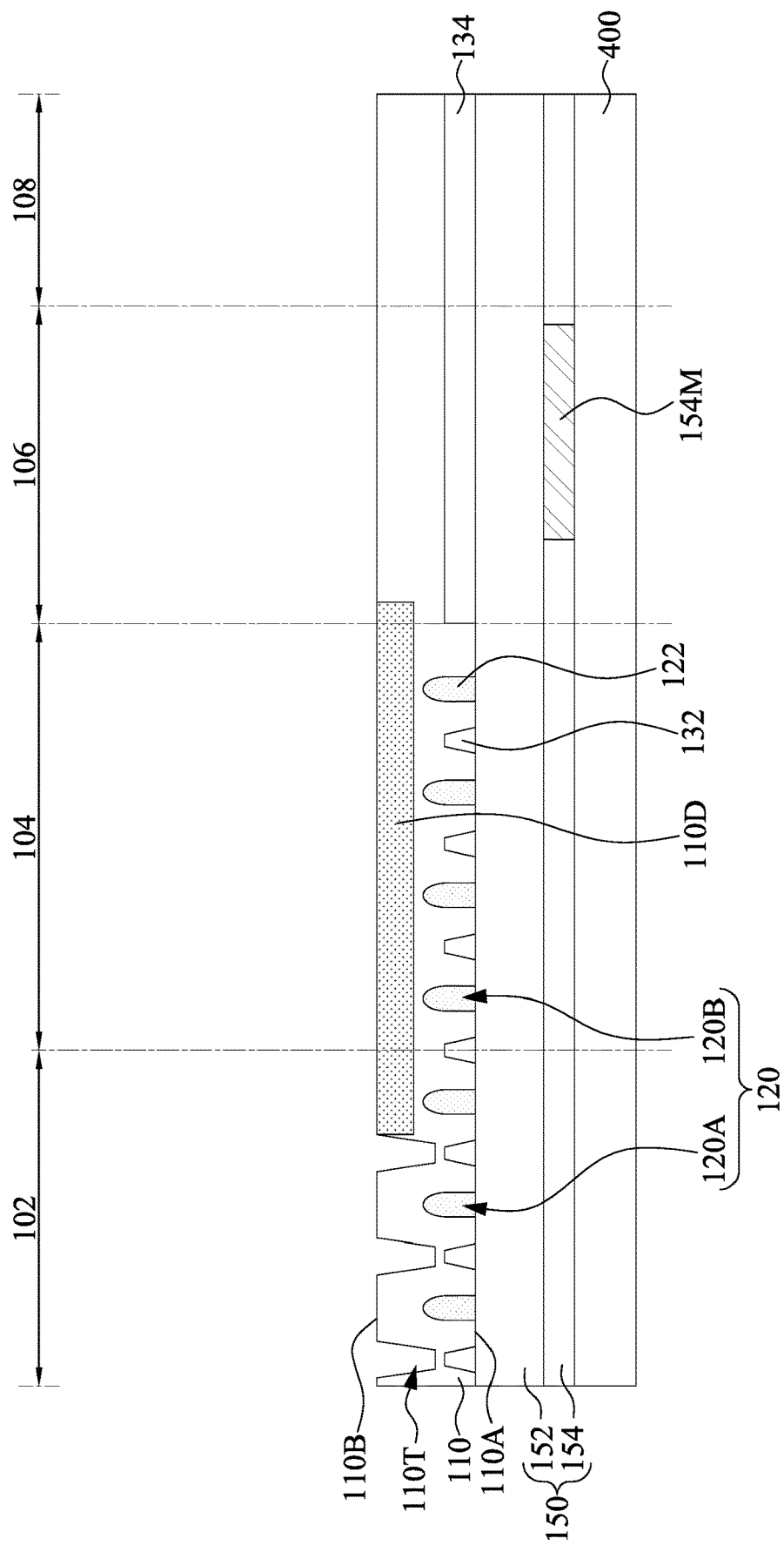

Reference is made to FIG. 8. The back surface 110B of the substrate 110 is patterned to form plural trenches 110T in the substrate 110. In some embodiments, the back surface 110B of the substrate 110 is patterned using a suitable anisotropic wet etching process, while using a patterned mask (e.g., photoresist or a non-photosensitive material, such as silicon nitride) as an etch mask. In some embodiments in which the substrate 110 is formed of silicon, the anisotropic wet etch may be performed using potassium hydroxide (KOH), ethylenediamine pyrocatechol (EDP), tetramethylammonium hydroxide (TMAH), or similar. The patterned mask may be removed after the etching process. In some embodiments in which the patterned mask is formed of a photoresist, the patterned mask may be removed using an ashing processes followed by a wet clean process. In other embodiments in which the patterned mask is formed of a non-photosensitive material, the patterned mask may be removed using a suitable etching process.

Figure 9:
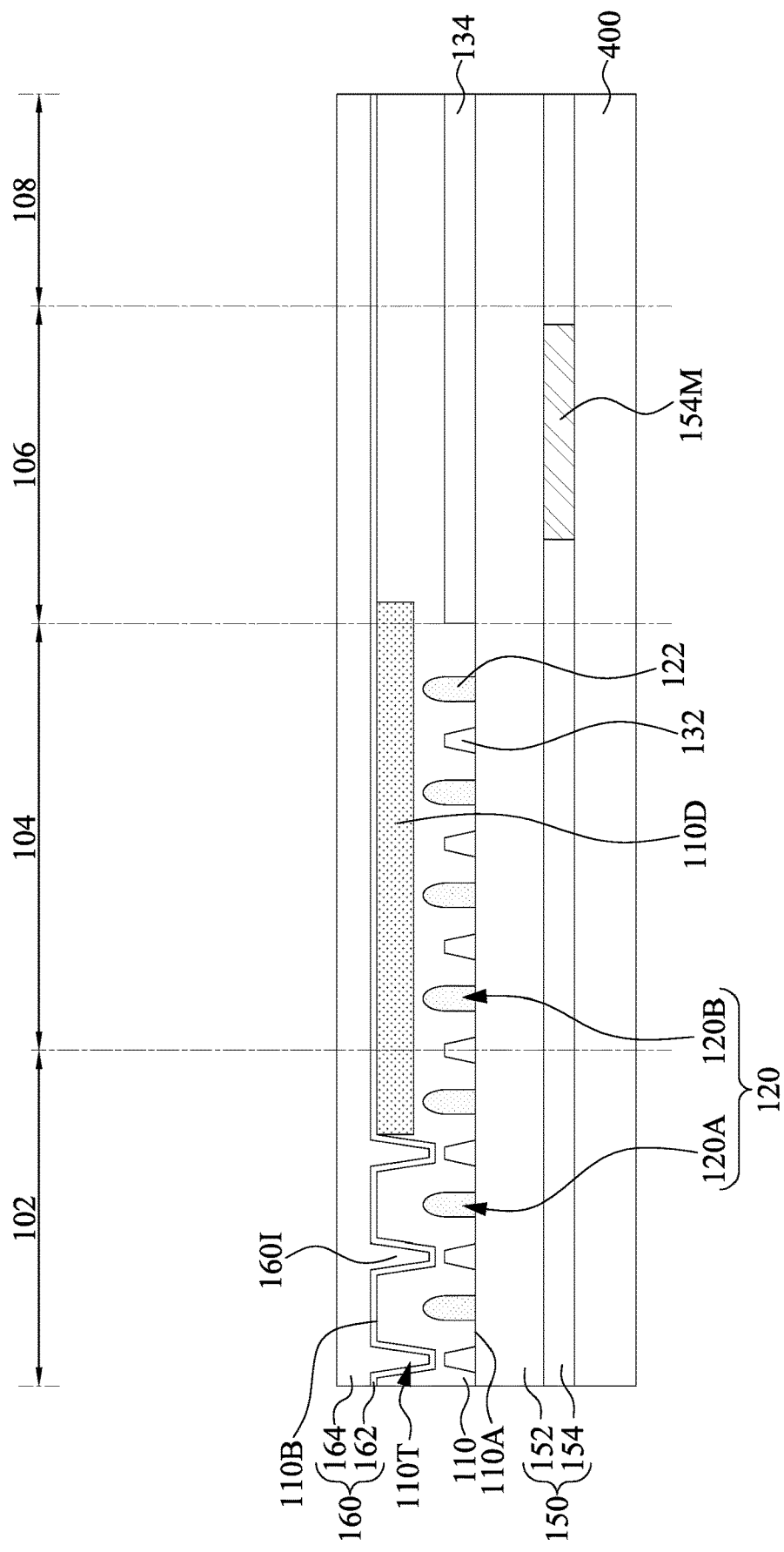

Reference is made to FIG. 9. After forming the trenches 110T, a dielectric layer 160 is formed on the back surface 110B of the substrate 110, thereby filling the trenches 110T. The dielectric layer 160 may include a charge accumulation layer 162 conformally formed on the back surface 110B of the substrate 110 and a buffer layer 164 over the charge accumulation layer 162.

In some embodiments, the charge accumulation layer 162 may include one or plural high-k dielectric materials. For example, the charge accumulation layer 162 may include a HfO$_2$ layer and a Ta$_2$O$_5$ layer over the HfO$_2$ layer. The charge accumulation layer 162 helps to accumulate negative or positive charges in the substrate 110 to an interface between the charge accumulation layer 162 and the substrate 110 to form electric dipoles, which functions as a carrier barrier to trap defects such as dangling bonds. The configuration of the charge accumulation layer 162 may reduce leakage current of the image sensor devices.

In some embodiments, the buffer layer 164 may be formed of silicon oxide, although other suitable dielectric materials may be used. In some embodiments, the buffer layer 164 may be formed using ALD, CVD, PECVD, the like, or a combination thereof. In some embodiments, the charge accumulation layer 162 and the buffer layer 164 is planarized using a grinding process, a chemical mechanical polishing (CMP) process, an etching process, or the like. Through the configuration, portions of the dielectric layers 162 and 164 in the trenches of the substrate 110 form the isolation structures 1601 between neighboring photosensitive pixels 120. The isolation structures 1601 may prevent electrical cross-talk between the photosensitive pixels 120. The isolation structures 1601 may be referred to as backside deep trench isolation (BDTI) structures. In some other embodiments, the charge accumulation layer 162 may be omitted.

Figure 10:
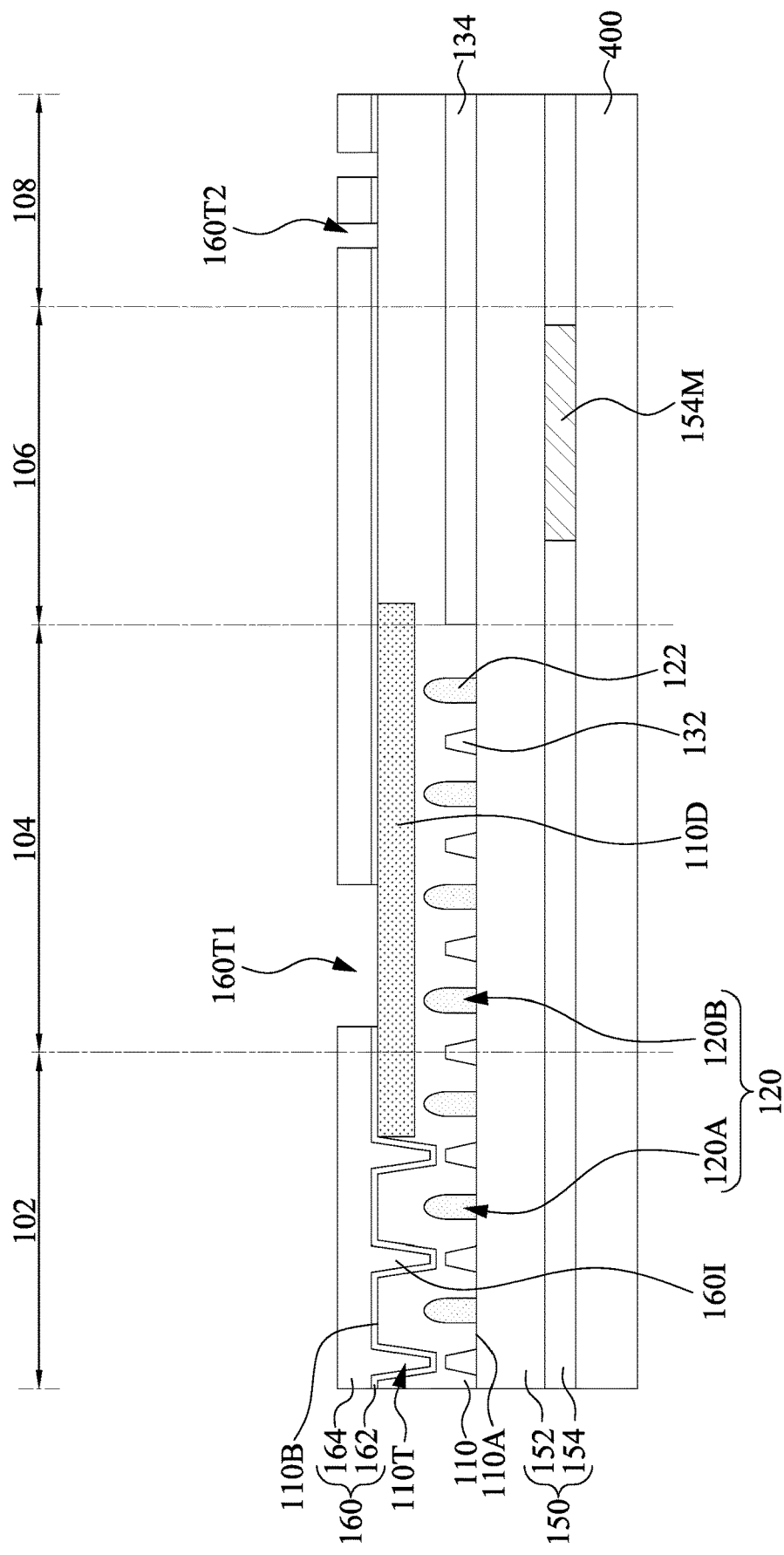

Reference is made to FIG. 10. The dielectric layer 160 is patterned to form one or more trenches 160T1 and 160T2 that expose the back surface 110B of the substrate 110 in the BLC region 104. In some embodiments, the dielectric layer 160 may be patterned using suitable photolithography and etching processes. For example, a photoresist is coated over the dielectric layer 160 (referring to FIG. 9) and then patterned using photolithography techniques to expose portions of the dielectric layer 160 in the BLC region 104 and the alignment mark region 108. Subsequently, an etching process is performed to remove the exposed portions of the dielectric layer 160, thereby exposing the underlying substrate 110. In some embodiments, the trench 160T1 has a ring shape or a closed loop shape from a top view as illustrated in FIG. 1A.

In some embodiments of the present disclosure, the trench 160T1 is located over the doped region 110D of the substrate 110 and exposing the doped region 110D of the substrate 110. The etching process of forming the trench 160T1 may damage the substrate 110, resulting in electrical leakage in the substrate 110 in the vicinity of the trench 160T1. However, because there is a doped region 110D spanning the trench 160T1, and the doped region 110D is of a conductivity type opposite the conductivity type of the substrate 110, a depletion region is thus formed in the vicinity of the PN junction formed between the doped region 110D and the substrate 110, which in turn can reduce the electrical leakage caused by the damages of the trench etching process. In some embodiments of the present disclosure, the trenches 160T2 may have substantially the same thickness as that of the trench 160T1. The trenches 160T2 may be used in alignment correction during photolithography processes.

Figure 11:
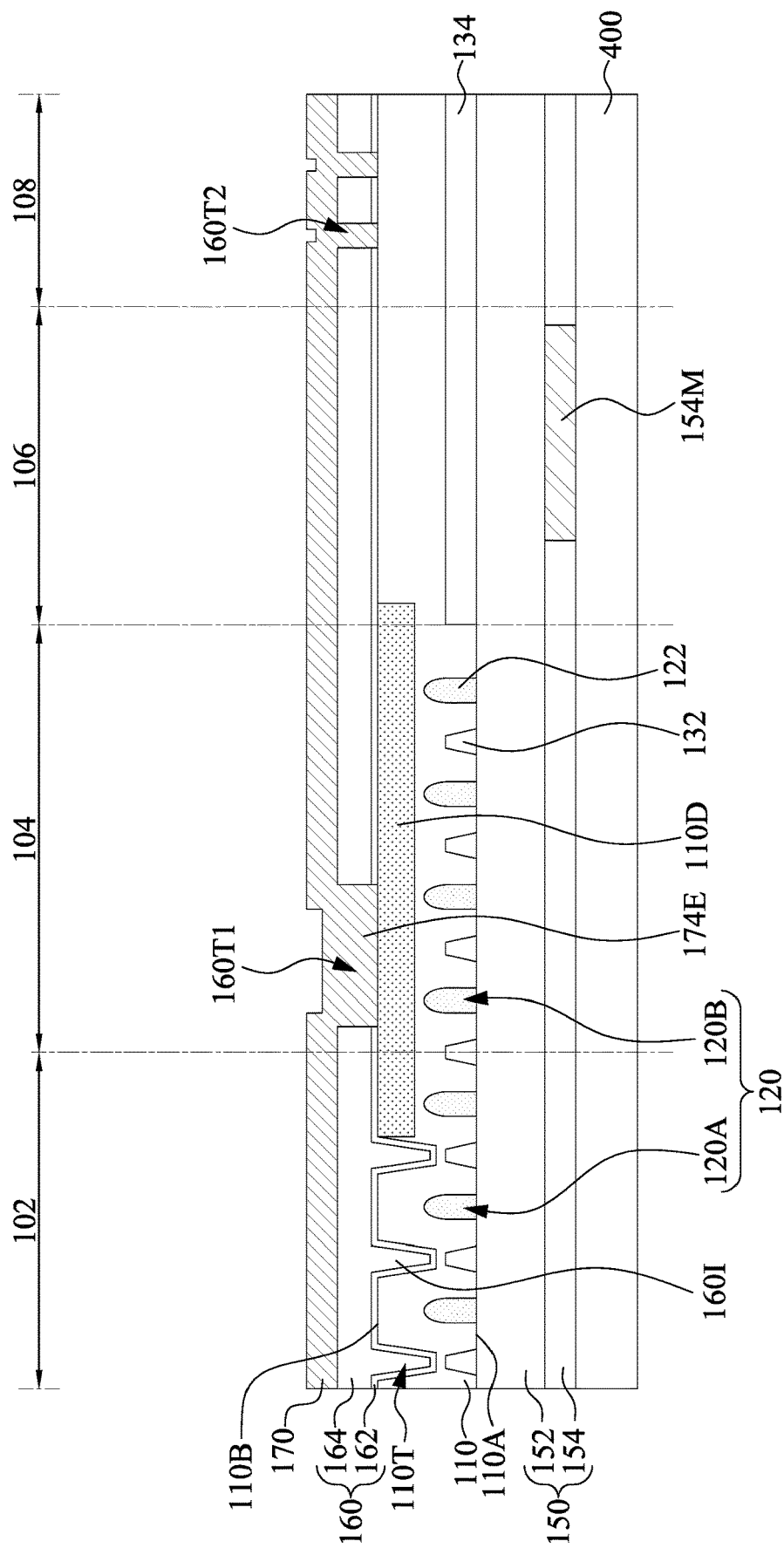

Reference is made to FIG. 11. A light blocking layer 170 is formed over the dielectric layer 160. The light blocking layer 170 may be a metal layer. In some embodiments, the light blocking layer 170 is made of a reflective metal material or a light absorption material. For example, the light blocking layer 170 may include Cu, Au, Ag, Al, Ni, W, alloys thereof, or the like and may be formed using PVD, plating, or the like. In some embodiments, prior to the formation of the light blocking layer 170, a barrier/adhesion layer (not shown) may be conformally formed over the dielectric layer 160. The barrier/adhesion layer may comprise titanium, titanium nitride, tantalum, tantalum nitride, or multilayers thereof and may be formed using PVD, CVD, MOCVD, plasma enhanced CVD (PECVD), atomic layer deposition (ALD), electroplating and/or the like.

In some embodiments, the light blocking layer 170 may fill the one or more trenches 160T1, and thereby forming one or more light blocking structures 174E in the trenches 160T1. In some embodiments where the trench 160T1 has a ring shape or closed loop shape from a top view as illustrated in FIG. 1A, the light blocking structure 174E also has a ring shape or closed loop shape from the top view as illustrated in FIG. 1A. The light blocking structures 174E can block lateral lights, thereby preventing the reference black level signals detected by reference photosensitive pixels 120B from being influenced by lights.

In furtherance of some embodiments, the light blocking layer 170 is formed such that the light blocking layer 170 are electrically coupled to the substrate 110, for example, through the light blocking structures 174E. For example, the light blocking structures 174E is in contact with the back surface 110B of the substrate 110. Such electrical coupling provides grounding to the light blocking layer 170.

Figure 12:
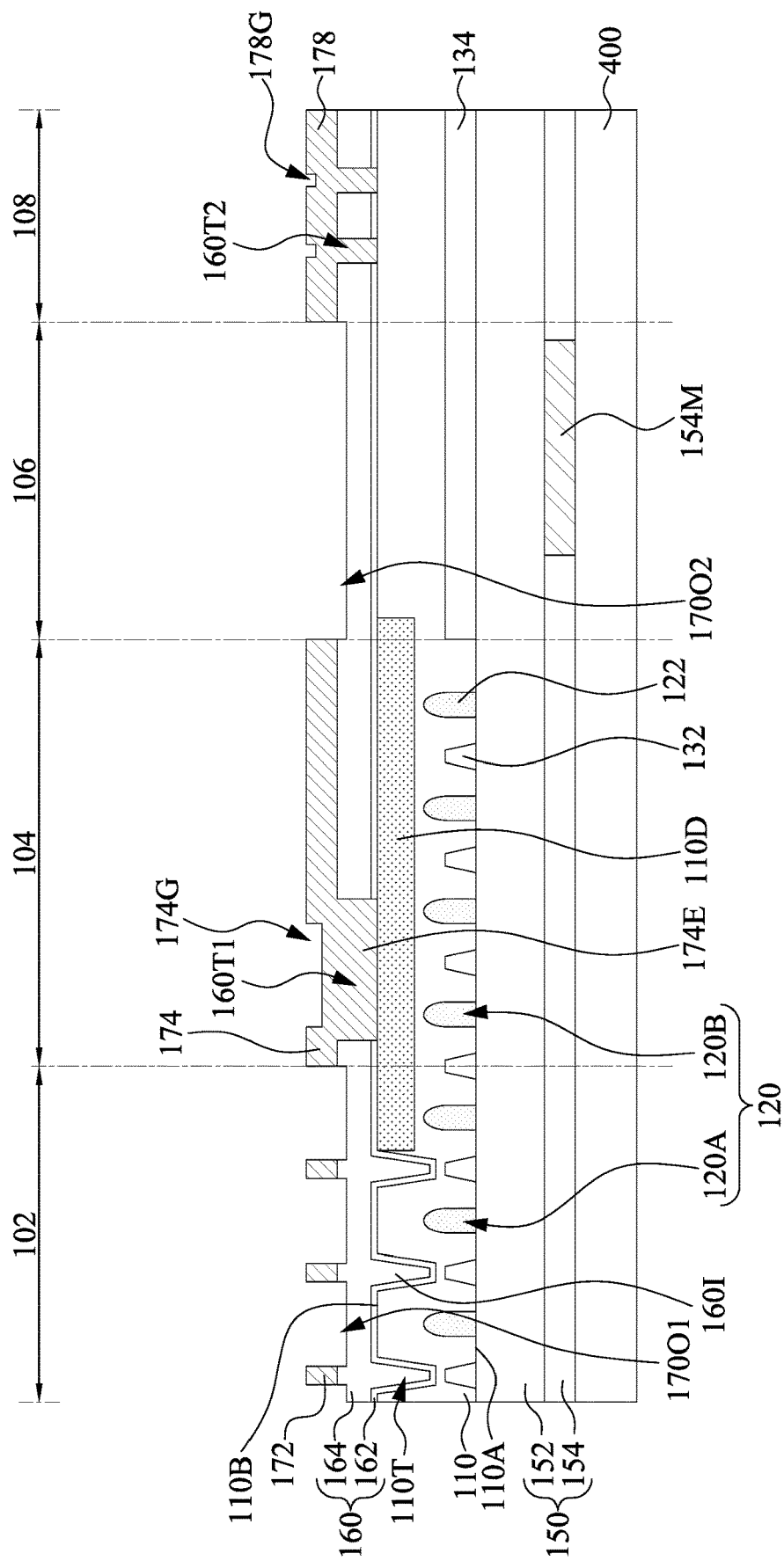

Reference is made to FIG. 12. The light blocking layer 170 (referring to FIG. 11) is patterned into a light blocking grid 172 in the pixel array region 102, a light blocking element 174 in the BLC region 104, and a light blocking element 178 in the alignment mark region 108. The patterning process may include suitable photolithography and etching processes. For example, a patterned mask (e.g., photoresist) is formed over the light blocking layer 170 (referring to FIG. 11) and exposing portions of the light blocking layer 170 in the pixel array region 102 and a portion of the light blocking layer 170 in the scribe line region 106. Subsequently, an etching process is performed to remove the exposed portions of the light blocking layer 170, thereby forming the openings 170O1 and 170O2 in the light blocking layer 170 in the pixel array region 102 and the scribe line region 106. The etching process may include wet etch, dry etch, or the combination thereof. For example, the etching process may include a dry etch using gas etchants such as $CL_2$, $HBr$, $CF_4$, or the like. The etching process may be performed until the dielectric layer 160 is exposed. In some embodiments, the exposed portions of the dielectric layer 160 may be consumed by the etching process and thus are recessed to fall below the lateral interface between the light blocking layer 170 and the dielectric layer 160. Through the patterning process, the dielectric layer 160 is exposed through the openings 170O1 and 170O2 in the light blocking layer 170. In some embodiments, the openings 170O1 are aligned with respective photosensitive pixels 120A. In some embodiments, the opening 170O2 is aligned with the conductive line 154M. In some embodiments, in the etching process, the BLC region 104 and the alignment mark region 108 are protected from etching, and the layers therein are not etched.

A remaining portion of the light blocking layer 170 in the BLC region 104 is referred to as the light blocking element 174. The light blocking element 174 blocks the light that otherwise would be received by the reference photosensitive pixels 120B. The light blocking element 174 has the light blocking structure 174E at a position adjacent to the pixel array region 102. The light blocking structure 174E has a bottom surface lower than a bottom surface of the light blocking grid 172. Through the configuration, the light blocking structure 174E may block lateral light, thereby preventing light from propagating toward the BLC region 104. For example, the light blocking structure 174E may reflect the lateral light back to the pixel array region 102. Alternatively, in some embodiments, the light blocking structure 174E may absorb the lateral light. The light blocking element 174 may be electrically coupled to the substrate 110, for example, through the light blocking structures 174E. For example, the light blocking structures 174E is in contact with the back surface 110B of the substrate 110. Such electrical coupling provides grounding to the light blocking layer 170. The grounding may release unwanted charges in the BLC region 104. In some embodiments, the light blocking element 174 may include a groove 174G corresponding to trench 160T1. For example, the groove 174G may be a ring-shaped groove in a top view that laterally surrounds or encircle the pixel array region 102.

A remaining portion of the light blocking layer 170 in the pixel array region 102 is referred to as the light blocking grid 172. The light blocking grid 172 has the openings 170O1 aligned with respective photosensitive pixels 120A. For example, in some embodiments, walls of the light blocking grid 172 may encircle each active photosensitive pixel 120A as viewed from top. Through the configuration, the light blocking grid 172 prevents optical cross-talk between neighboring active photosensitive pixels 120A. In the present embodiments, the light blocking grid 172 and the light blocking element 174 are connected and electrically coupled to each other. In some other embodiments, after the patterning process, the light blocking grid 172 may be spaced apart from the light blocking element 174. In alternative embodiments, the entirety of the light blocking layer 170 in pixel array region 102 is removed by the patterning process. That is, after the patterning process, the light blocking layer 170 may not include the light blocking grid 172.

A portion of the light blocking layer 170 remaining in the alignment mark region 108 may be referred to as the light blocking element 178. The light blocking element 178 may be referred to as an alignment mark (e.g., a scribe lane primary mark (SPM) or an overlay (OVL) mark). In some embodiments, the light blocking element 178 may include grooves 178G corresponding to trench 160T2. For example, grooves 178G formed in light blocking element 178 allow for alignment correction to detect misalignment during a photolithography process. In alternative embodiments, the entirety of the light blocking layer 170 in alignment mark region 108 is removed by the patterning process.

Figure 13:
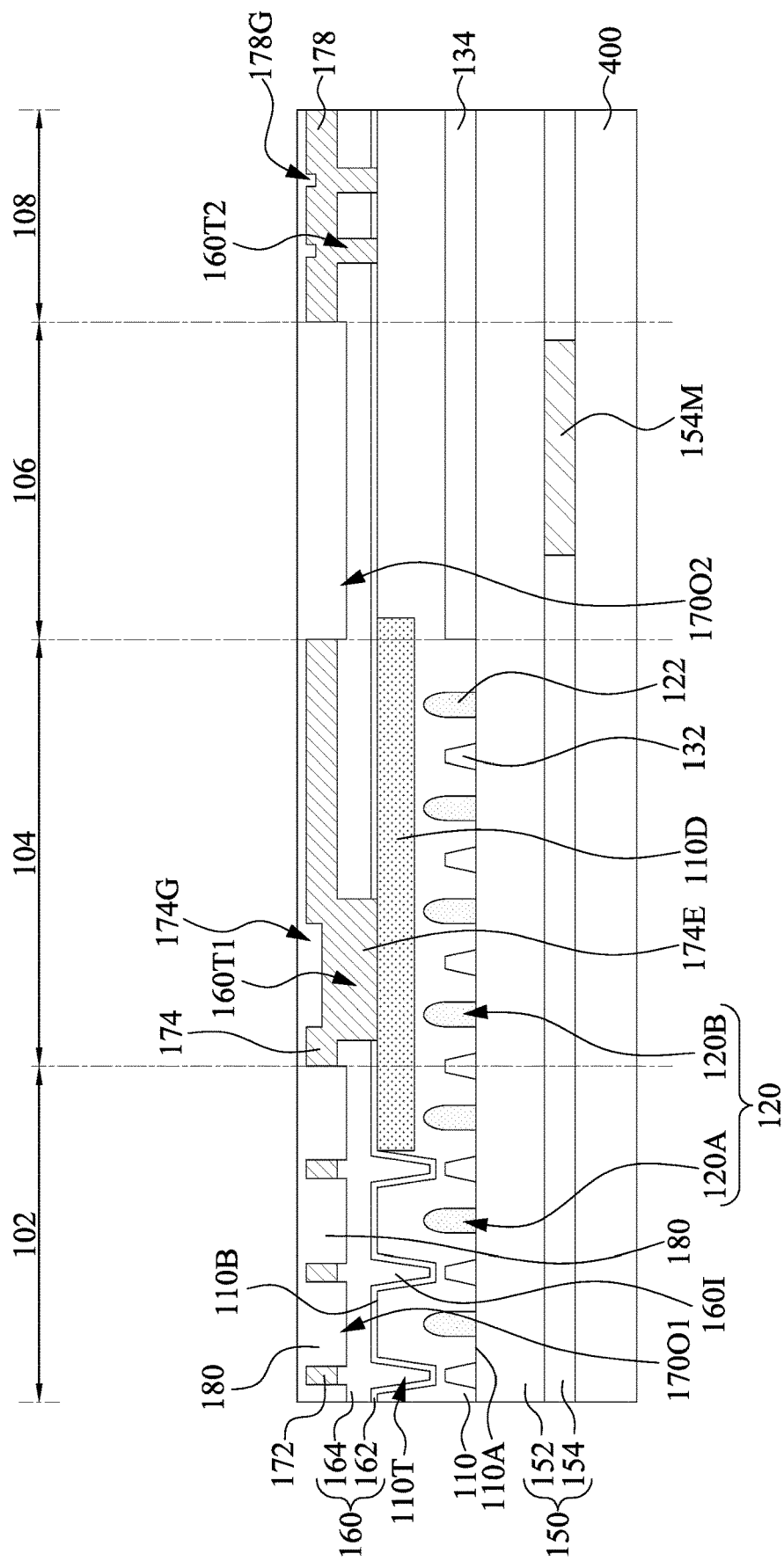

Reference is made to FIG. 13. A dielectric layer 180 is formed over the light blocking grid 172 and the light blocking element 174 and fills the openings 170O1 and 170O2. In some embodiments, the dielectric layer 180 may be formed using similar materials and methods as the dielectric layer 164 described above with reference to FIG. 9 and the description is not repeated herein. In some embodiments, the dielectric layer 180 and the dielectric layer 164 may be formed of a same material. In other embodiments, the dielectric layer 180 and the dielectric layer 164 may be formed of different materials. Subsequently, the dielectric layer 180 is planarized using a grinding process, a chemical mechanical polishing (CMP) process, an etching process, or the like.

Figure 14:
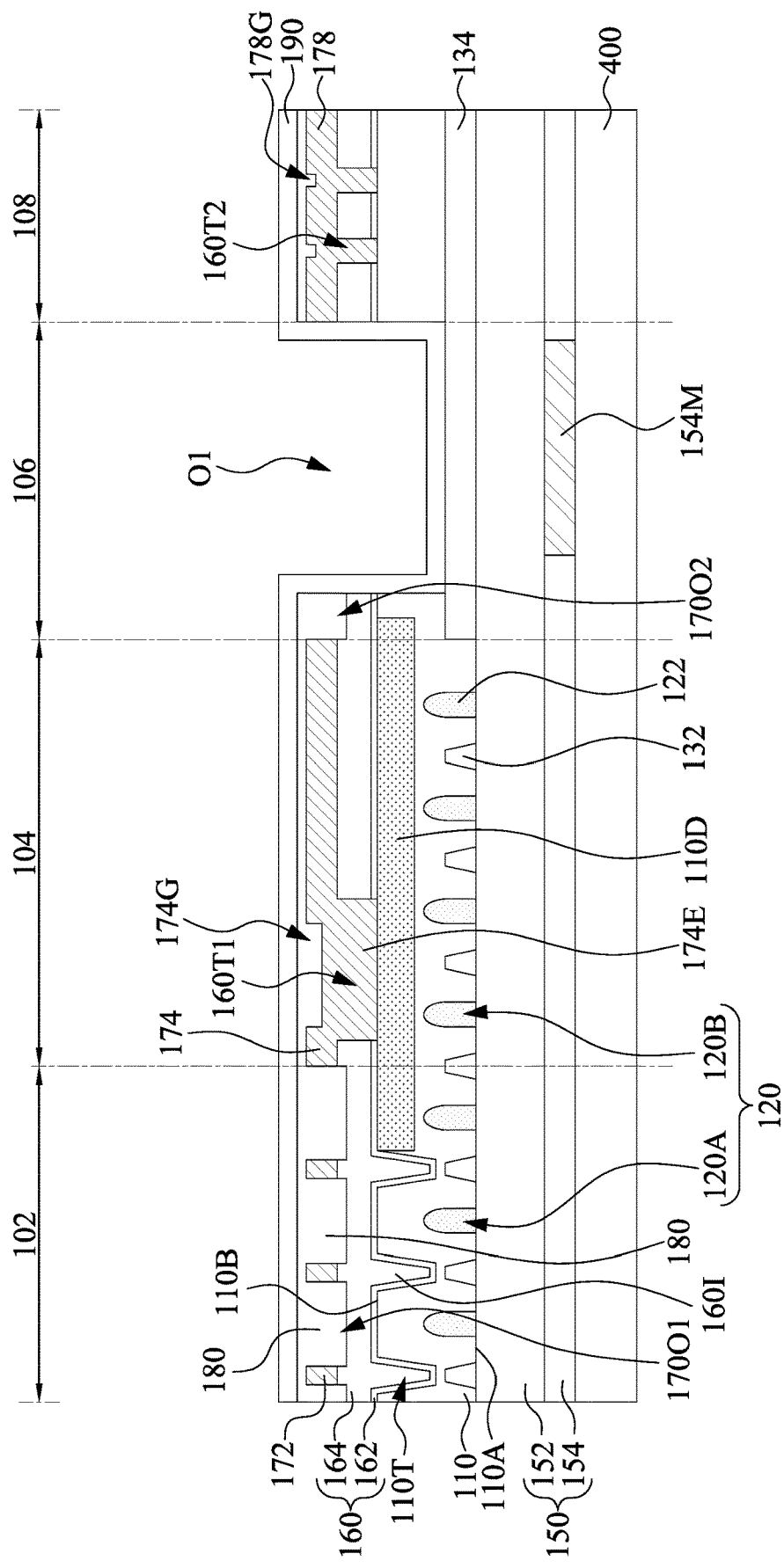

Reference is made to FIG. 14. An etching process is performed to remove a portion of the dielectric layer 180, a portion of the dielectric layer 160, and a portion of the substrate 110 in the scribe line region 106, thereby forming opening O1 in the scribe line region 106. The opening O1 extends from the back surface 110B of the substrate 110 toward isolation layer 134. Subsequently, a buffer oxide layer 190 is formed over a remaining portion of the dielectric layer 180 in the regions 102, 104, and 108, and extends into the opening O1 in the scribe line region 106.

Figure 15:
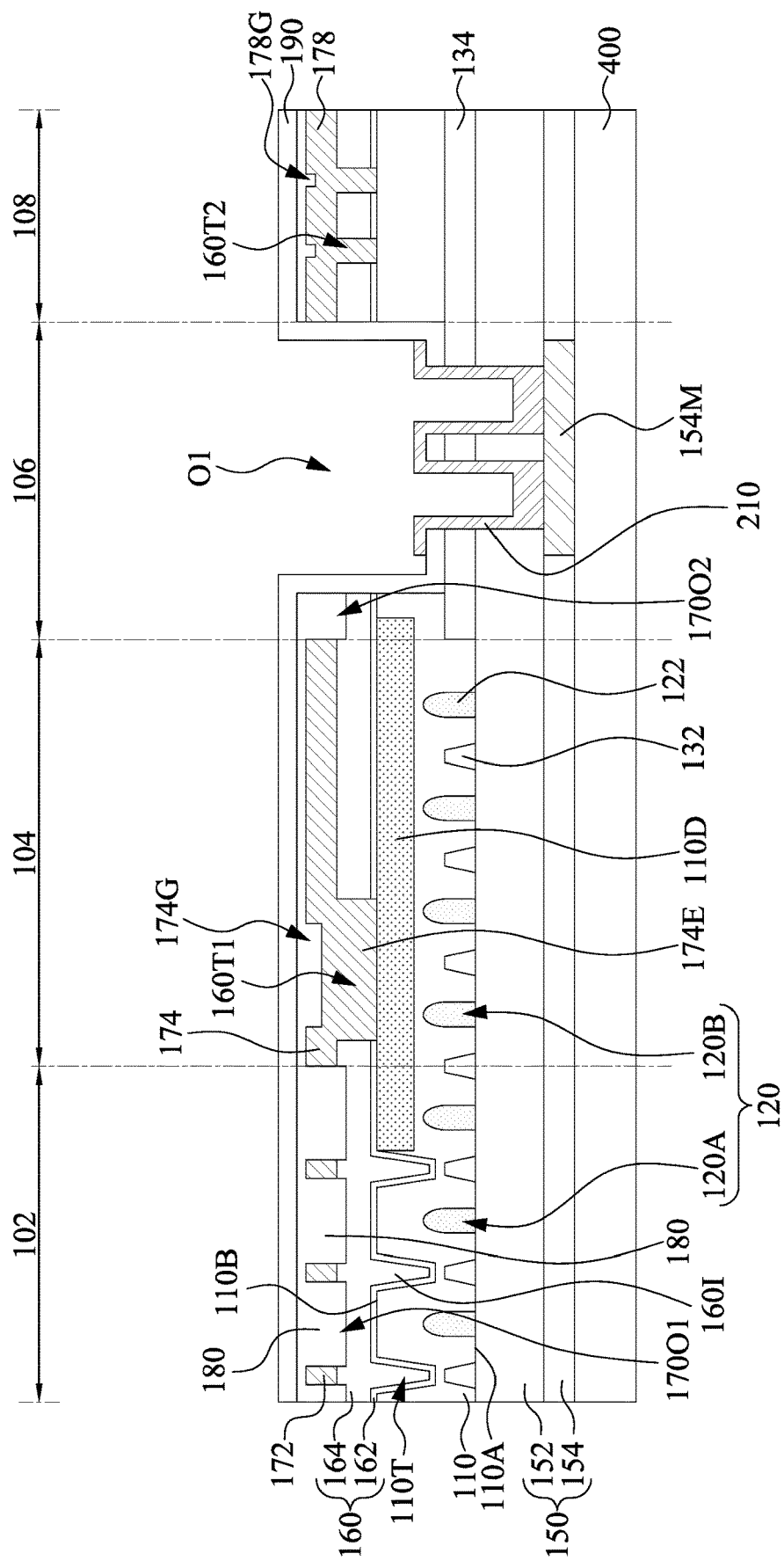

Reference is made to FIG. 15. The buffer oxide layer 190 and the underlying dielectric materials (e.g., the isolation layer 134 and the ILD layer 152) in the scribe line region 106 are patterned to expose the conductive lines 154M of the interconnect structure 150. Subsequently, a bonding pad 210 is formed on the interconnect structure 150 in a manner so that the bonding pad 210 is electrically coupled to the exposed conductive lines 154M and separated from the sidewall of the substrate 110 by the buffer oxide layer 190. The bonding pad 210 is used for forming an electrical connection, such as a wire bonding (not shown), to electrically couple to the circuits and the photosensitive pixels 120. The bonding pad 210 may be coupled to the photosensitive pixels 120 through interconnect structure 150.

Figure 16:
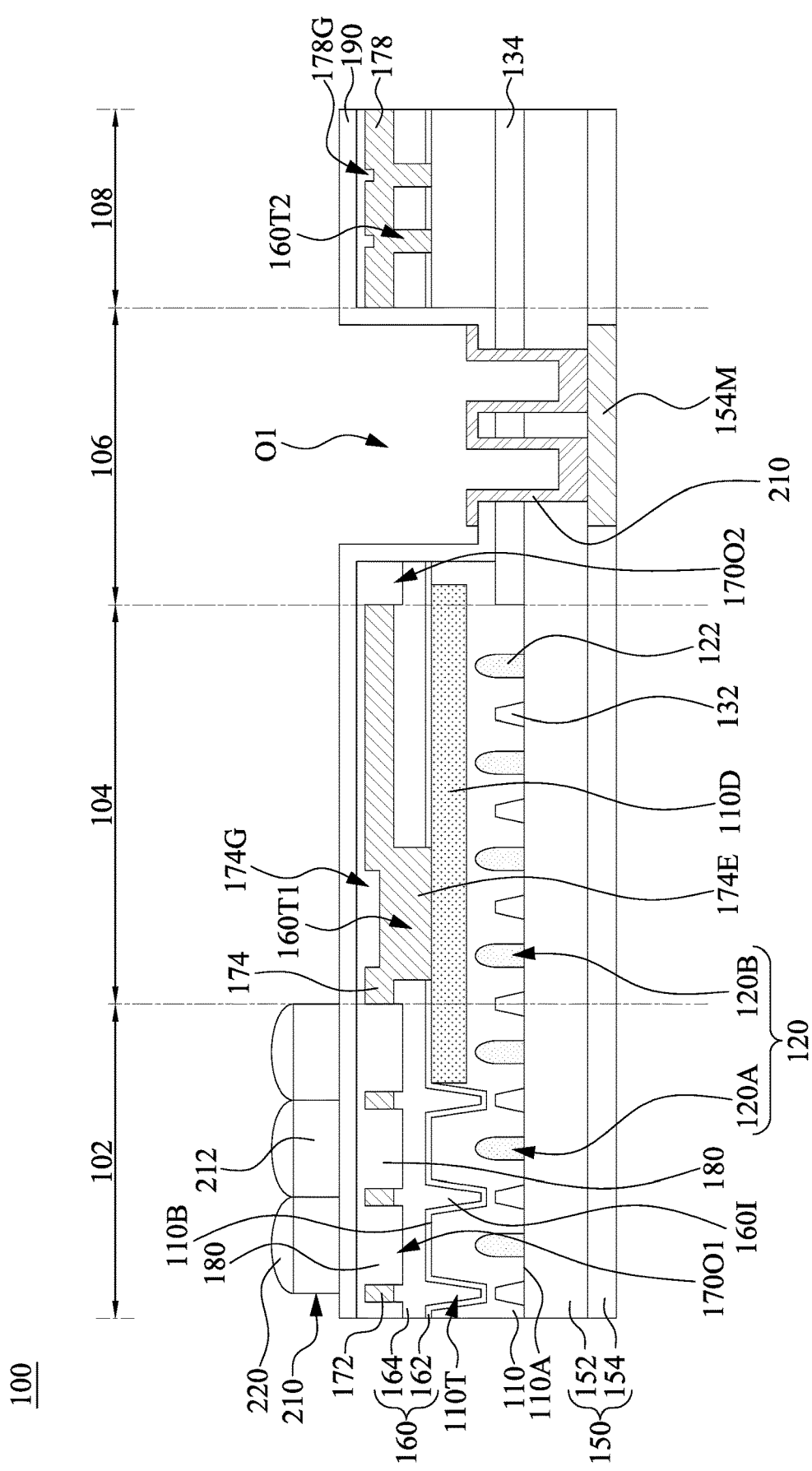

Reference is made to FIG. 16. A color filter layer 210 is formed over the dielectric layer 180 in the pixel array region 102. In some embodiments, the color filter layer 210 includes plural color filters 212, aligned with respective active photosensitive pixels 120A. The color filters 212 may be used to allow specific wavelengths of light to pass while reflecting other wavelengths, thereby allowing the image sensor device 100 to determine the color of the light being received by the active photosensitive pixels 120A. For example, the color filters 212 may be a red, green, and blue filter as used in a Bayer pattern. Other combinations, such as cyan, yellow, and magenta, may also be used. The number of different colors of the color filters 212 may also vary. The color filters 212 may comprise a polymeric material or resin, such as polymethyl-methacrylate (PMMA), polyglycidyl-methacrylate (PGMA), or the like, which includes colored pigments.

An array of micro-lenses 220 is formed over the color filter layer 210. In some embodiments, the micro-lenses 220 are aligned with respective color filters 212 and respective active photosensitive pixels 120A. The micro-lenses 220 may be formed of any material that may be patterned and formed into lenses, such as a high transmittance acrylic polymer. In an embodiment, a micro-lens layer may be formed using a material in a liquid state by, for example, spin-on techniques. Other methods, such as CVD, PVD, or the like, may also be used. The planar material for the micro-lens layer may be patterned using suitable photolithography and etching methods to pattern the planar material in an array corresponding to the array of the active photosensitive pixels 120A. The planar material may then be reflowed to form an appropriate curved surface for the micro-lenses 220. Subsequently, the micro-lenses 220 may be cured using, for example, a UV treatment. In some embodiments, after forming the micro-lenses 220, the carrier substrate 400 (referring to FIG. 15) may be de-bonded form the image sensor device 100 and the image sensor device 100 may undergo further processing such as, for example, packaging.

FIGS. 17-28 illustrate a method for fabricating an image sensor device 100 at various intermediate stages of manufacture according to some embodiments of the present disclosure. For simplicity, some components of the image sensor device 100 are omitted. The illustration is merely exemplary and is not intended to be limiting beyond what is specifically recited in the claims that follow. It is understood that additional operations may be provided before, during, and after the operations shown by FIGS. 17-28, and some of the operations described below can be replaced or eliminated for additional embodiments of the method. The order of the operations/processes may be interchangeable. As aforementioned, the image sensor device 100 may include a pixel array region 102, a black level correction (BLC) region 104, a scribe line region 106, and an alignment mark region 108. The dashed lines in FIGS. 17-28 designate the approximate boundaries between the regions 102-108.

Figure 17:
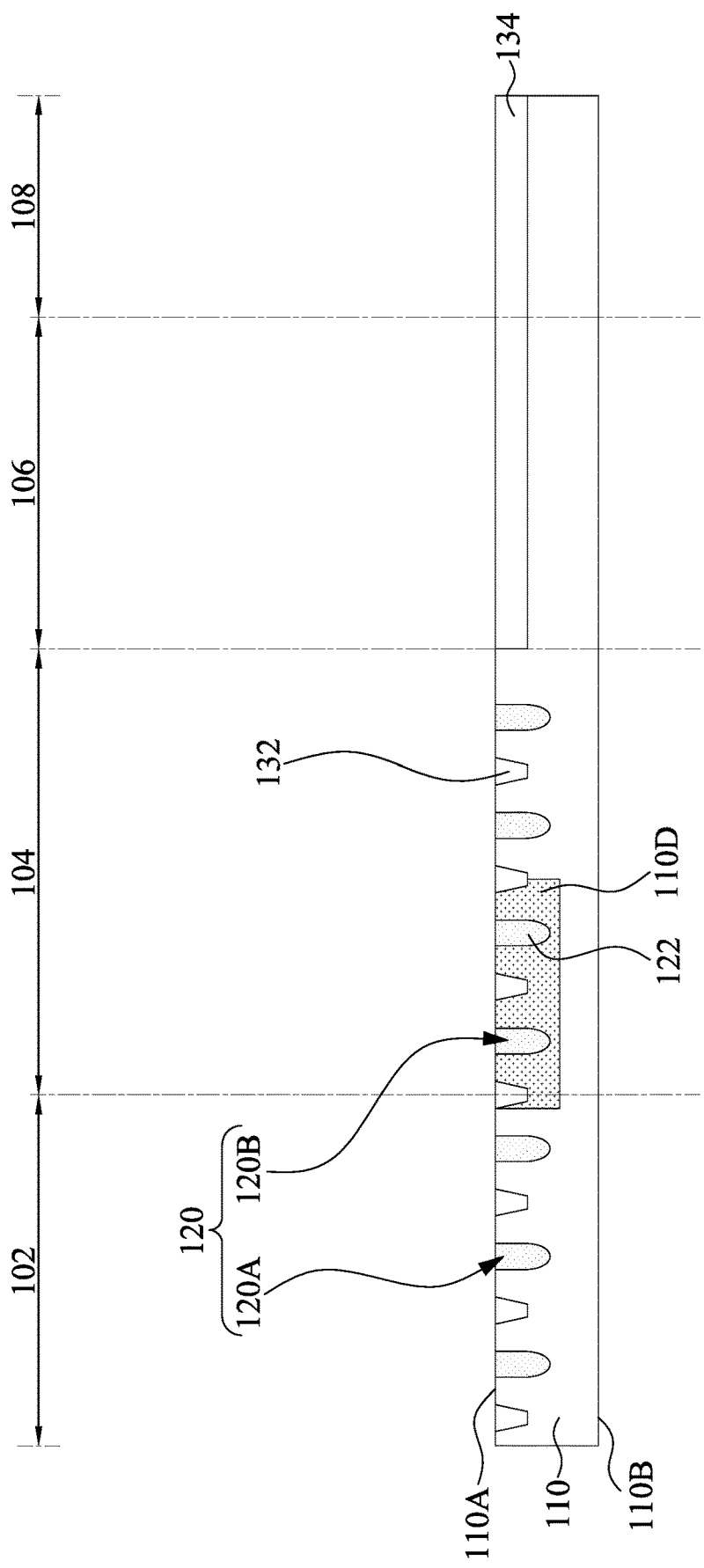
FIGS. 17-28 illustrate a method for fabricating an image sensor device at various intermediate stages of manufacture according to some embodiments of the present disclosure.

Reference is made to FIG. 17. Photosensitive regions 122 are formed in a substrate 110. As discussed previously, the substrate 110 may include, for example, bulk silicon, doped or undoped, or an active layer of a semiconductor-on-insulator (SOI) substrate. Photosensitive regions 122 are formed, for example, by implanting suitable impurity ions into the substrate 110 from the front surface 110A of the substrate 110. The isolation structures 132 and the isolation layer 134 may be formed at the front surface 110A of the substrate 110 before or after the formation of the photosensitive region 122.

In the present embodiments, before or after the formation of the photosensitive regions 122, an ion implantation process is performed to the front surface 110A of the substrate 110 in BLC region 104, thereby forming a doped region 110D in the substrate 110 in BLC region 104. The doped region 110D may be located in a portion of the BLC region 104 adjacent to the pixel array region 102, and leaving another portion of the BLC region 104 away from the pixel array region 102 free of the doped region 110D. Through the configuration, some of the photosensitive regions 122 may be free of the doped region 110D. Therefore, even though some of the photosensitive pixels 120B in the doped region 110D may not generate suitable reference black level signals, other photosensitive pixels 120B free of the doped region 110D may generate signals suitable for reference black level signals.

In some embodiments, the doped region 110D may extend from the front surface 110A of the substrate 110 toward the back surface 110B of the substrate 110. In some embodiments, the doped region 110D is further present in the substrate 110 in the pixel array region 102. In some embodiments where the photosensitive regions 122 are n-type regions formed in a p-type semiconductor layer, the doped region 110D are implanted with n-type dopants (e.g., phosphorus). In some embodiments where the photosensitive regions 122 are p-type regions formed in an n-type semiconductor layer, the doped region 110D are implanted with p-type dopants (e.g., boron). Stated differently, the doped region 110D and the photosensitive regions 122 are of the same conductivity type. The doped region 110D may have a ring shape or a closed loop shape from a top view as illustrated in FIG. 1A. In some embodiments, the dose of the ion implantation process may be in a range from about 100E2 to about 100E5 atoms/cm$^2$, but other ranges are within the scope of various embodiments. In some embodiments, the dopant concentration of the doped region 110D is lower than that of the photosensitive regions 122. In some embodiments, the dopant concentration of the doped region 110D is higher than that of the photosensitive regions 122.

In the present embodiments, after or before the formation of the doped region 110D, transfer gate transistors (not illustrated) and floating diffusion capacitors (not illustrated) may be formed at the front surface 110A of the substrate 110, thereby forming photosensitive pixels 120 (including photosensitive pixels 120A and 120B). The photosensitive pixels 120 may include respective photosensitive region 122, respective transfer gate transistors (not illustrated), and respective floating diffusion capacitors (not illustrated). In each photosensitive pixel 120, a first source/drain region of the corresponding transfer gate transistor is electrically coupled to a respective photosensitive region 122, a second source/drain region of the corresponding transfer gate transistor is electrically coupled to a respective floating diffusion capacitor. Other details of the photosensitive pixels 120, isolation structures 132, and the doped region 110D are discussed previously with respect to FIGS. 5 and 7, and not repeated herein for the sake of brevity.

Figure 18:
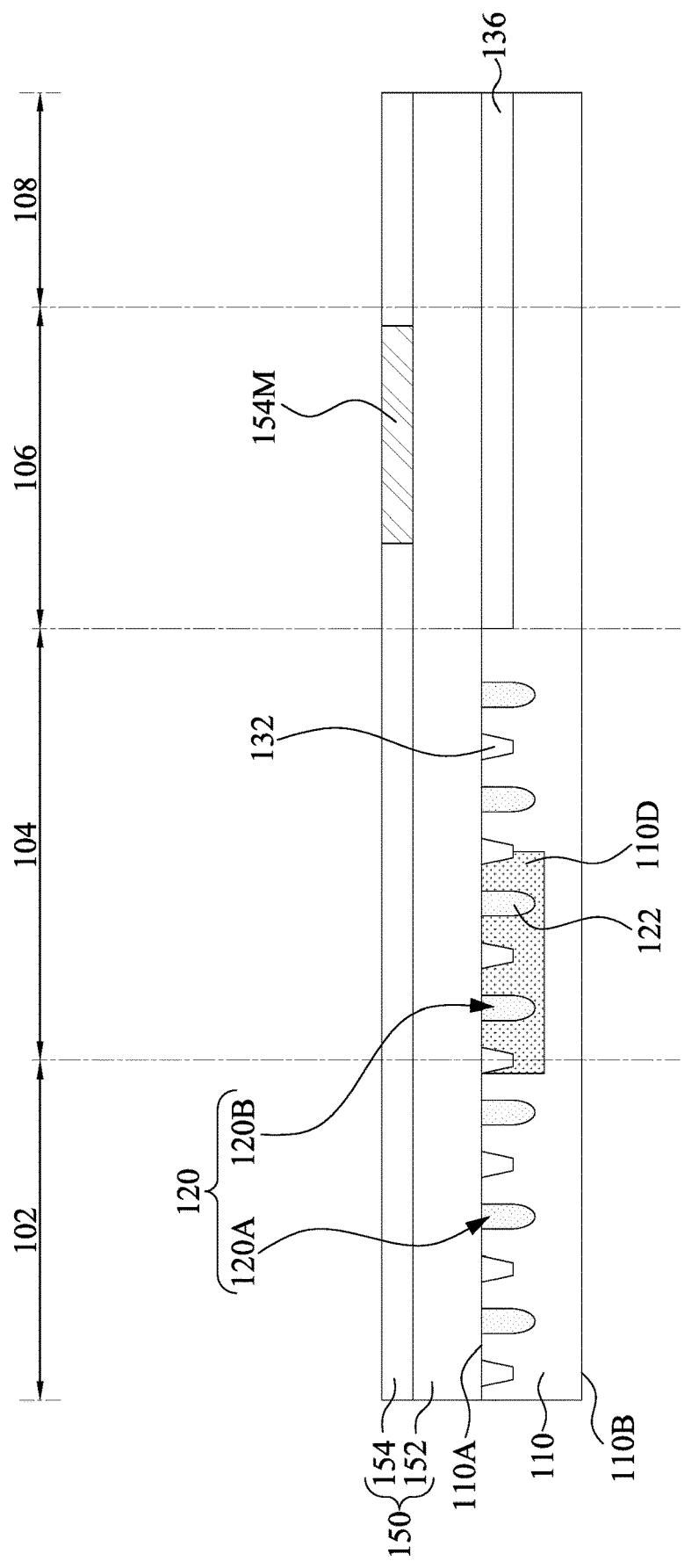

Reference is made to FIG. 18. After the formation of the doped region 110D and the photosensitive pixels 120, an interconnect structure 150 may be formed on the front surface 110A of the substrate 110, thereby forming electrical circuits with the photosensitive pixels 120. The interconnect structure 150 may include an ILD layer 152 and/or IMD layers 154 containing conductive features (e.g., conductive lines and vias comprising copper, aluminum, tungsten, combinations thereof, and the like) formed using any suitable method, such as damascene, dual damascene, or the like. For example, the interconnect structure 150 include a conductive line 154M as shown in the figure. The ILD 152 and IMDs 154 may include low-k dielectric materials disposed between such conductive features. In some embodiments, prior to the formation of the interconnect structure 150, one or more active and/or passive devices may be formed on the front surface 110A of the substrate 110 in addition to the photosensitive pixels 120 including the photosensitive regions 122, the transfer gate transistors, and the floating diffusion capacitors (not illustrated). One of ordinary skill in the art will appreciate that the above examples are provided for illustrative purposes only and are not meant to limit the present disclosure in any manner. Other circuitry may be used as appropriate for a given application.

Figure 19:
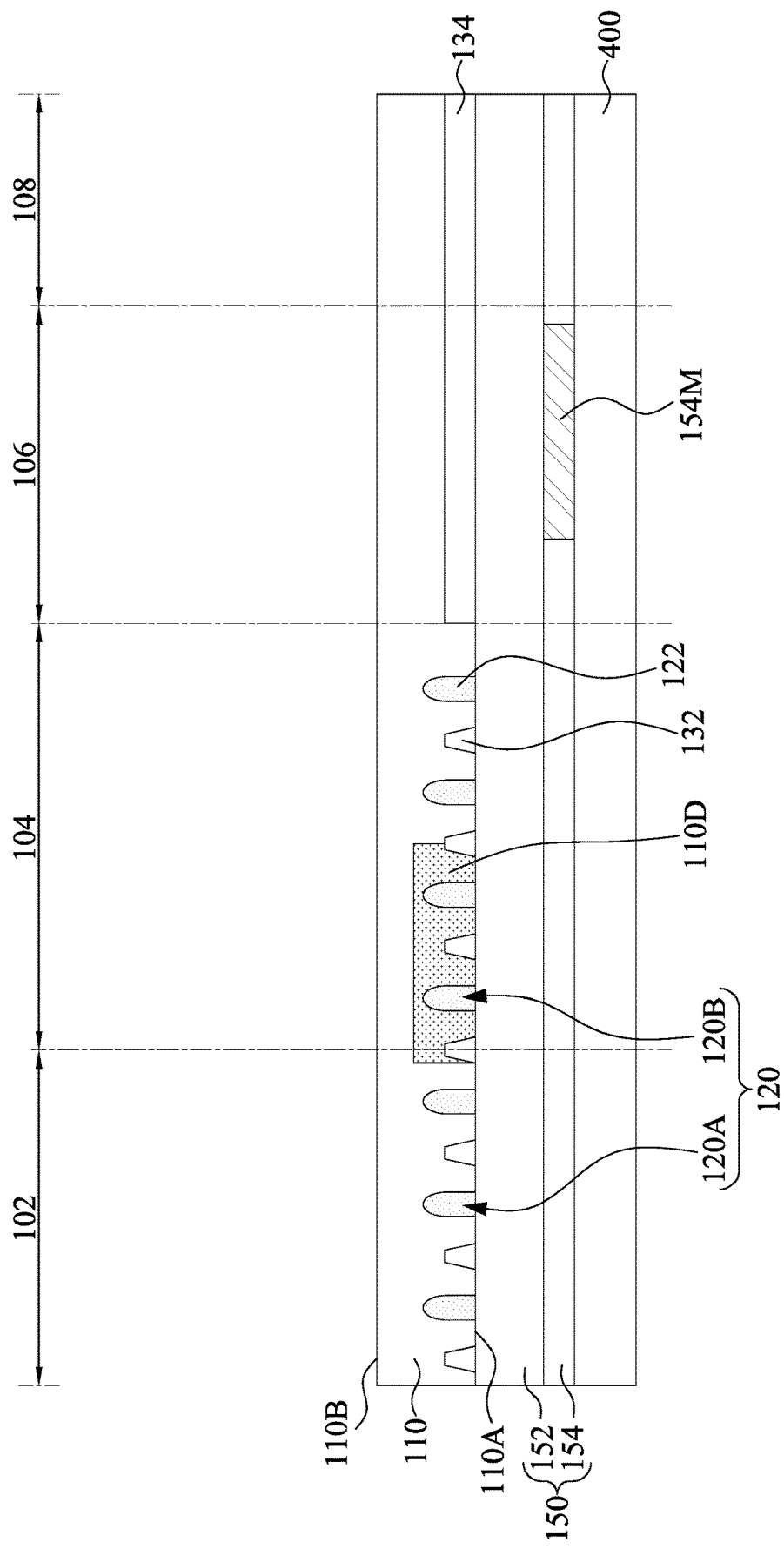

Reference is made to FIG. 19. The structure of FIG. 18 is flipped and bonded to a carrier substrate 400 such that the front surface 110A of the substrate 110 faces the carrier substrate 400 and the back surface 110B of the substrate 110 is exposed for further processing. Various bonding techniques may be employed to achieve bonding between the structure of FIG. 18 and the carrier substrate 400. In such embodiments, the carrier substrate 400 provides temporary support and is de-bonded from the image sensor device 100 (referring to FIG. 28) after completing the process steps performed on the back surface 110B of the substrate 110. After the image sensor device 100 and the carrier substrate 400 are bonded, a thinning process may be performed on the back surface 110B of the substrate 110 to thin down the substrate 110. In some embodiments, the thinning process serves to allow more light to pass through from the back surface 110B of substrate 110 to the photosensitive regions 122 of the photosensitive pixels 120 without being absorbed by the substrate 110. Other details of the bonding techniques are discussed previously with respect to FIG. 6, and not repeated herein.

Figure 20:
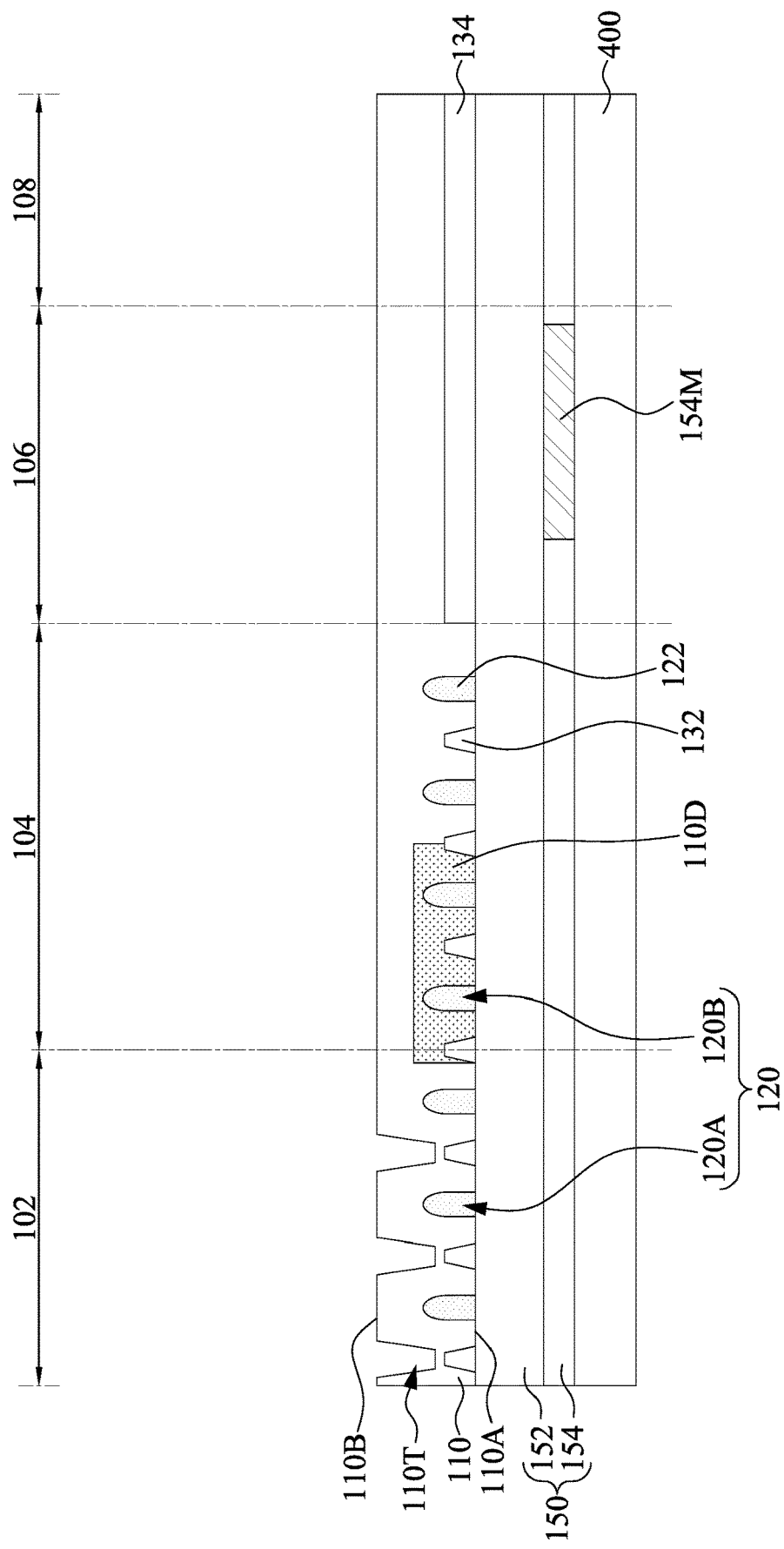

Reference is made to FIG. 20. The back surface 110B of the substrate 110 is patterned to form plural trenches 110T in the substrate 110. In some embodiments, the back surface 110B of the substrate 110 is patterned using a suitable anisotropic wet etching process, while using a patterned mask as an etch mask. The patterned mask may be removed after the etching process. Other details regarding the formation of the trenches 110T in the substrate 110 are discussed previously with respect to FIG. 8, and not repeated herein.

Figure 21:
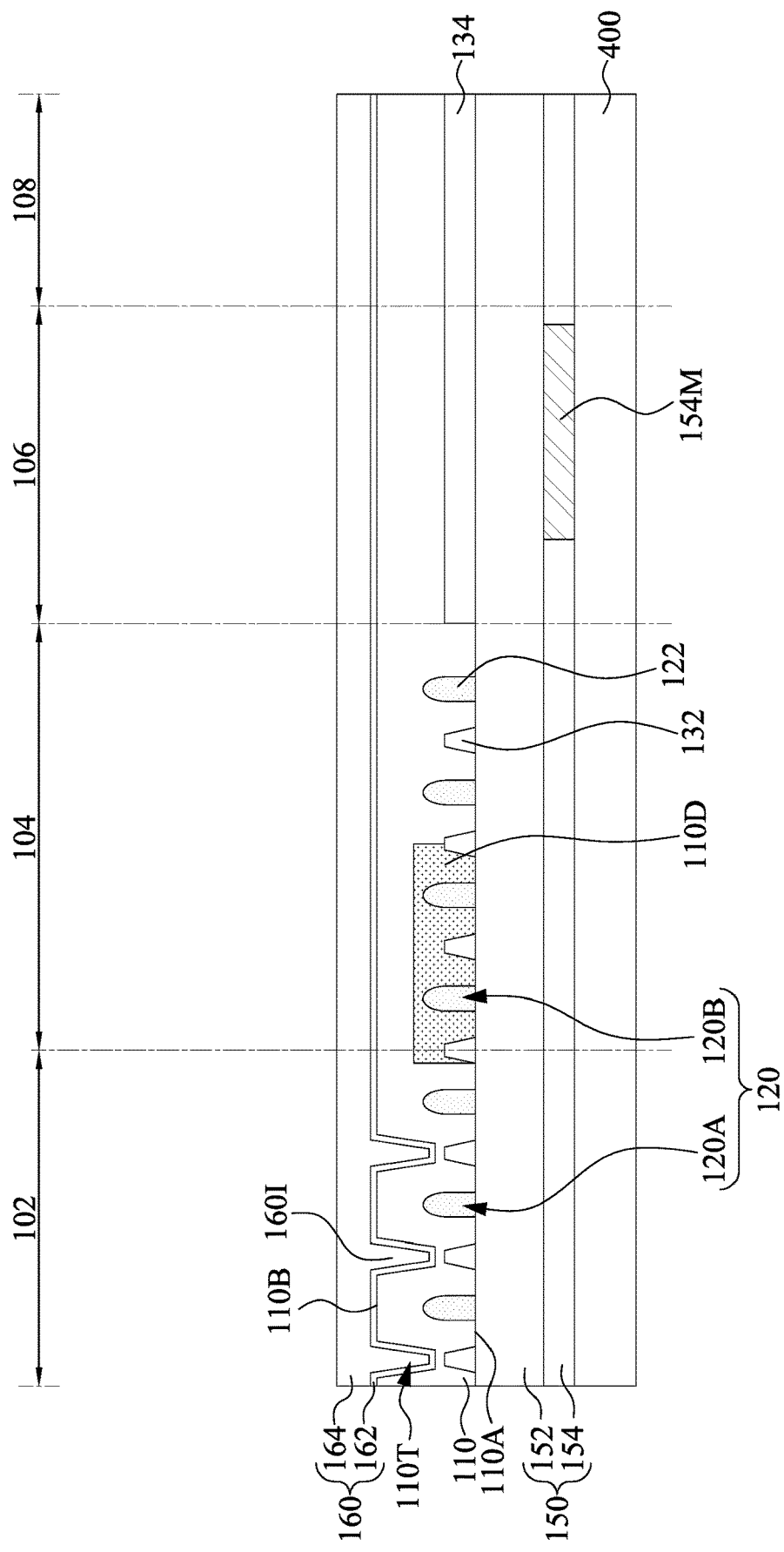

Reference is made to FIG. 21. After forming the trenches 110T, a dielectric layer 160 is formed on the back surface 110B of the substrate 110, thereby filling the trenches 110T. The dielectric layer 160 may include a charge accumulation layer 162 conformally formed on the back surface 110B of the substrate 110 and a buffer layer 164 over the charge accumulation layer 162. In some embodiments, the charge accumulation layer 162 and the buffer layer 164 is planarized. Through the configuration, portions of the dielectric layers 162 and 164 in the trenches of the substrate 110 form the isolation structures 160I between neighboring photosensitive pixels 120. The isolation structures 160I may prevent electrical cross-talk between the photosensitive pixels 120. In some other embodiments, the charge accumulation layer 162 may be omitted. Other details regarding the formation of the dielectric layer 160 are discussed previously with respect to FIG. 9, and not repeated herein.

Figure 22:
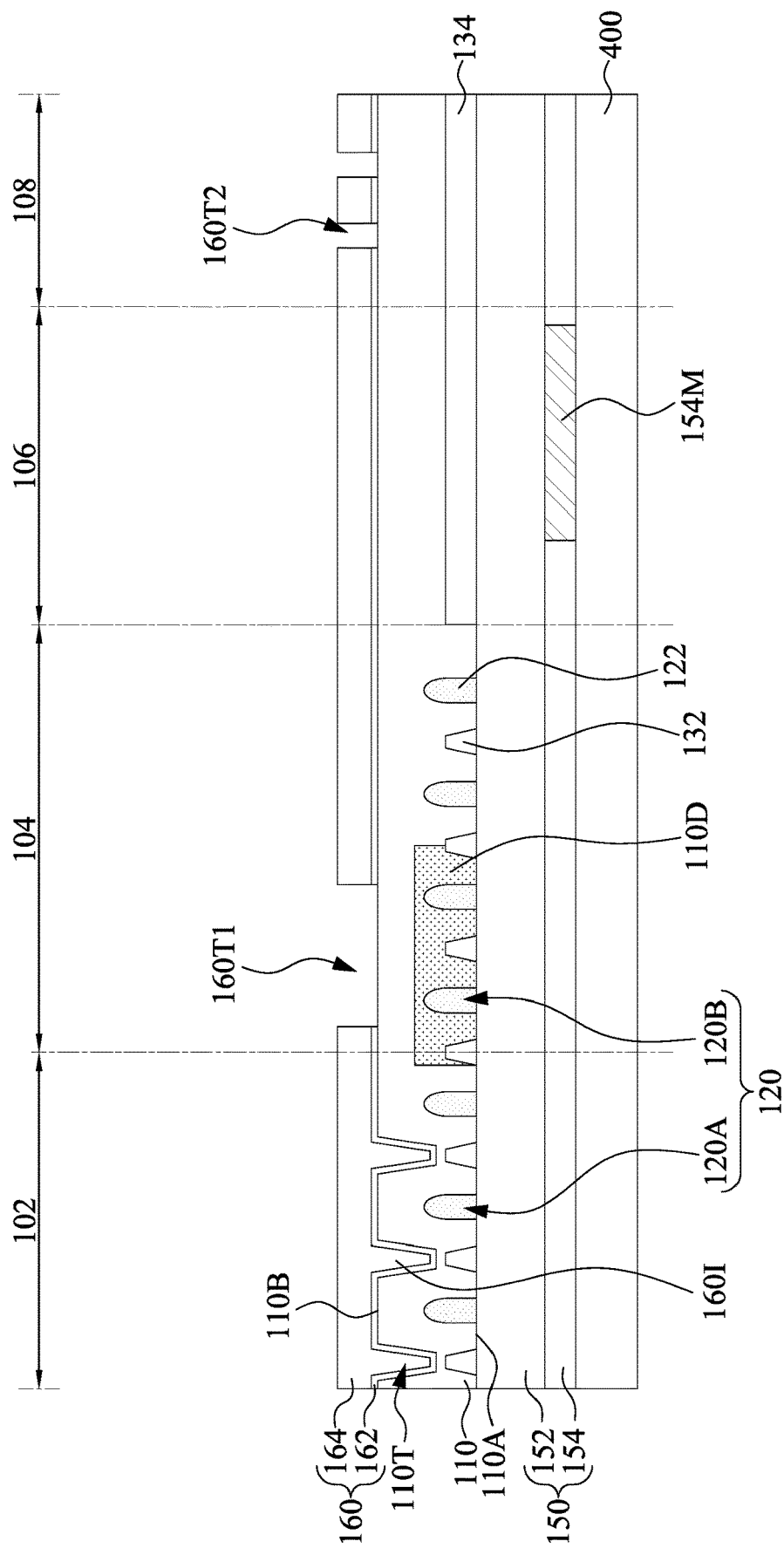

Reference is made to FIG. 22. The dielectric layer 160 is patterned to form one or more trenches 160T1 and 160T2 that expose the back surface 110B of the substrate 110 in the BLC region 104. In some embodiments of the present disclosure, the trench 160T1 is located over the doped region 110D of the substrate 110. The etching process of forming the trench 160T1 may damage the substrate 110, resulting in electrical leakage in the substrate 110 in the vicinity of the trench 160T1. However, because there is a doped region 110D spanning the trench 160T1, and the doped region 110D is of a conductivity type opposite the conductivity type of the substrate 110, a depletion region is thus formed in the vicinity of the PN junction formed between the doped region 110D and the substrate 110, which in turn can reduce the electrical leakage caused by the damages of the trench etching process. The trenches 160T2 are used for alignment correction during photolithography processes. Other details regarding patterning the dielectric layer 160 are discussed previously with respect to FIG. 10, and not repeated herein.

Figure 23:
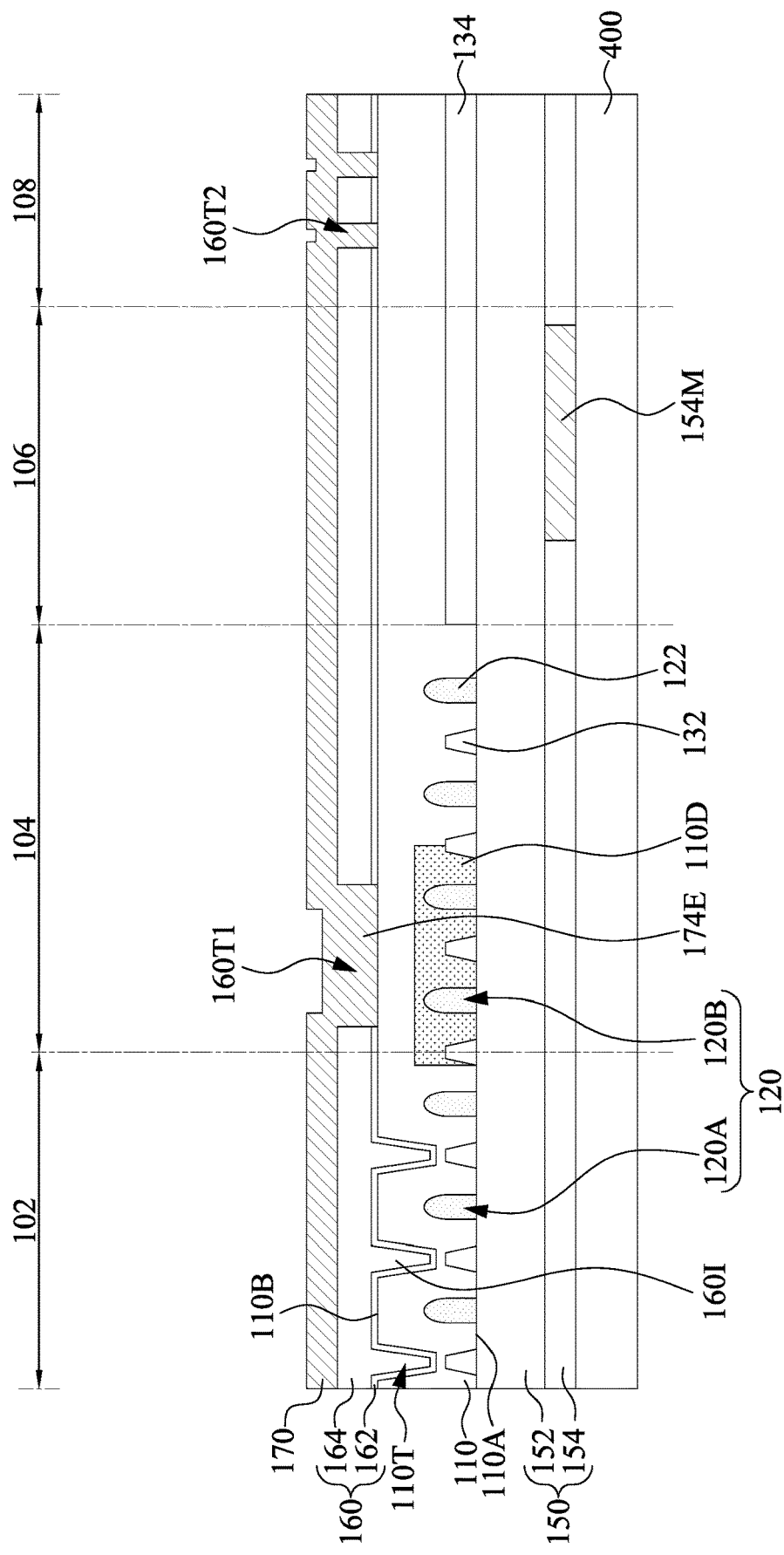

Reference is made to FIG. 23. A light blocking layer 170 is formed over the dielectric layer 160. The light blocking layer 170 may be a metal layer. In some embodiments, the light blocking layer 170 is made of a reflective metal material or a light absorption material. For example, the light blocking layer 170 may include aluminum, copper, nickel, tungsten, alloys thereof, or the like and may be formed using PVD, plating, or the like. In some embodiments, the light blocking layer 170 may fill the one or more trenches 160T1, and thereby forming one or more light blocking structures 174E in the trenches 160T1. Other details regarding the formation of the light blocking layer 170 are discussed previously with respect to FIG. 11, and not repeated herein.

Figure 24:
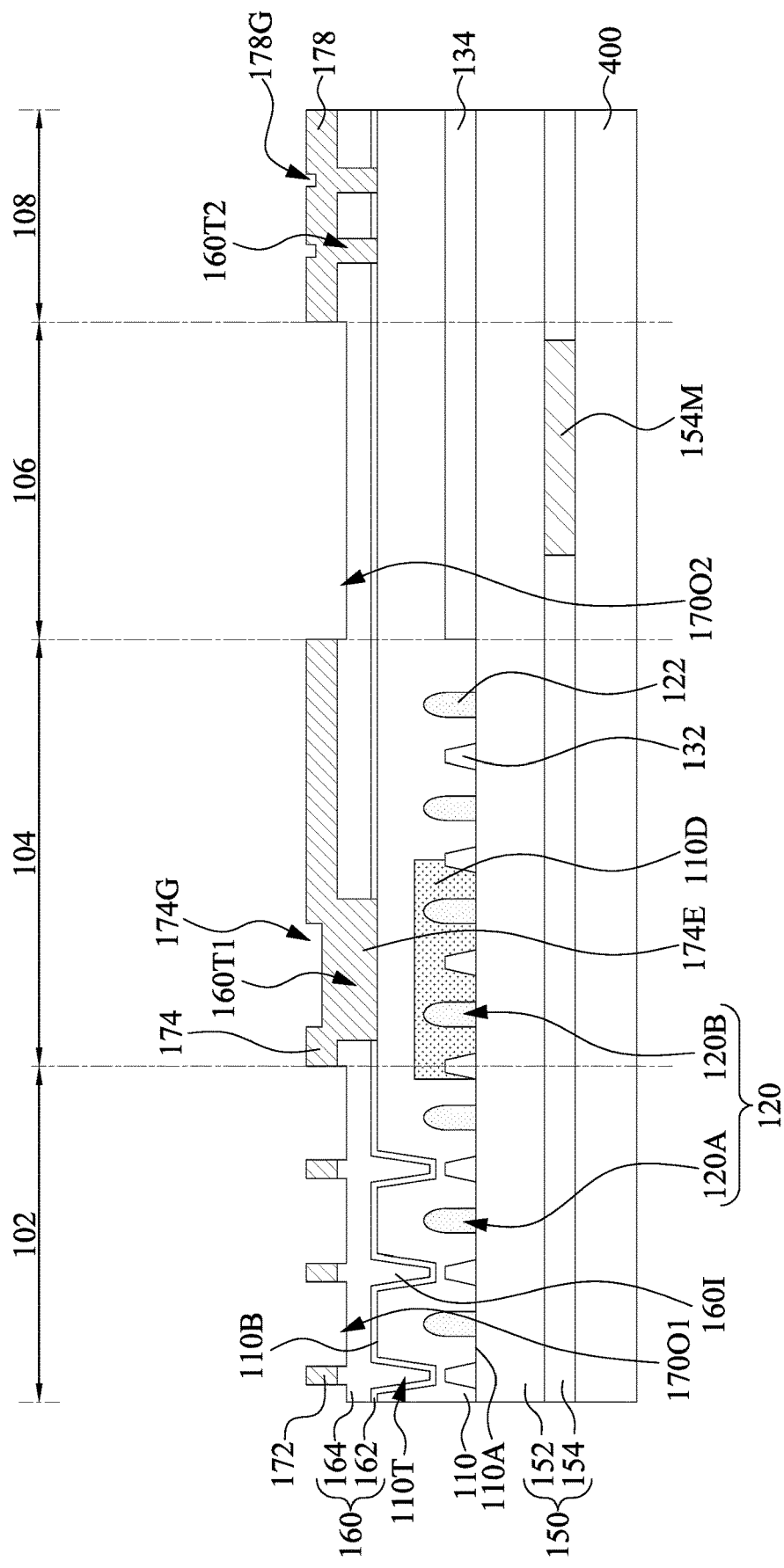

Reference is made to FIG. 24. The light blocking layer 170 (referring to FIG. 23) is patterned into a light blocking grid 172 in the pixel array region 102, a light blocking element 174 in the BLC region 104, and a light blocking element 178 in the alignment mark region 108. The patterning process results in openings 170O1 and 170O2 in the light blocking layer 170, and the dielectric layer 160 is exposed through the openings 170O1 and 170O2. The patterning process may include suitable photolithography and etching processes. In some embodiments, in the etching process, the BLC region 104 and the alignment mark region 108 are protected from etching, and the layers therein are not etched. Through the patterning process, the light blocking grid 172 may have the openings 170O1 aligned with respective photosensitive pixels 120A. The light blocking element 174 blocks the light that otherwise would be received by the reference photosensitive pixels 120B. In some embodiments, the opening 170O2 is aligned with the conductive line 154M in the scribe line region 106. The light blocking element 178 may serve as an alignment mark in subsequent process.

In some embodiments, the light blocking element 174 in the BLC region 104 has a light blocking structure 174E at a position adjacent to the pixel array region 102. The light blocking structure 174E has a bottom surface lower than a bottom surface of the light blocking grid 172. Through the configuration, the light blocking structure 174E may block lateral light, thereby preventing light from propagating toward the BLC region 104.

The light blocking element 174 may be electrically coupled to the substrate 110, for example, through the light blocking structures 174E. For example, the light blocking structures 174E is in contact with the back surface 110B of the substrate 110. Such electrical coupling provides grounding to the light blocking layer 170. In the present embodiments, the light blocking grid 172 and the light blocking element 174 may be electrically coupled to each other. In some other embodiments, the light blocking grid 172 may be electrically isolated from the light blocking element 174. In alternative embodiments, the entirety of the light blocking layer 170 in pixel array region 102 is removed by the patterning process. Other details regarding patterning the light blocking layer 170 are discussed previously with respect to FIG. 12, and not repeated herein.

Figure 25:
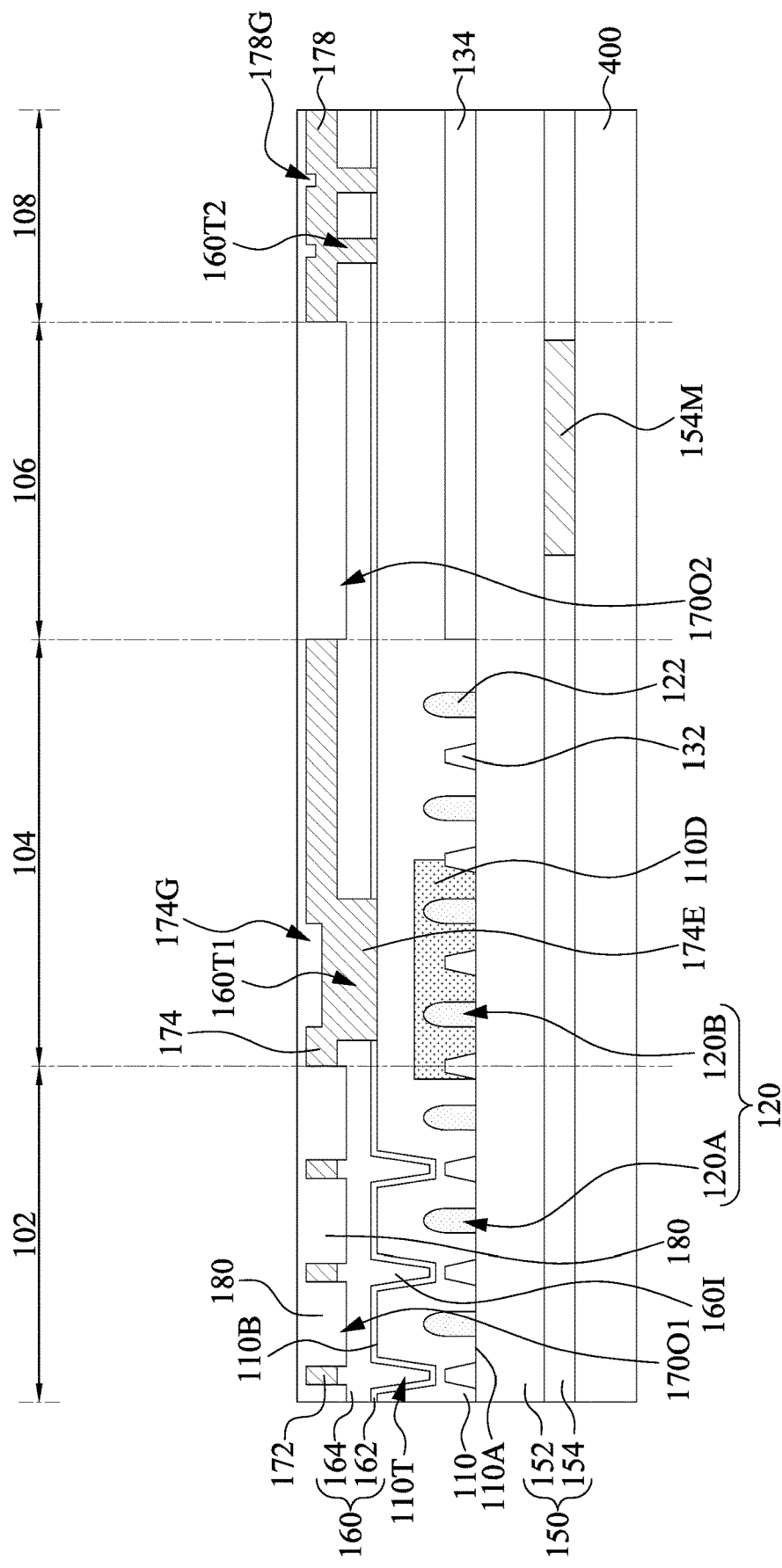

Reference is made to FIG. 25. A dielectric layer 180 is formed over the light blocking grid 172 and the light blocking element 174 and fills the openings 170O1 and 170O2. Subsequently, the dielectric layer 180 is planarized using a grinding process, a chemical mechanical polishing (CMP) process, an etching process, or the like. Other details regarding the formation of the dielectric layer 180 are previously illustrated with reference to FIG. 13, and not repeated herein.

Figure 26:
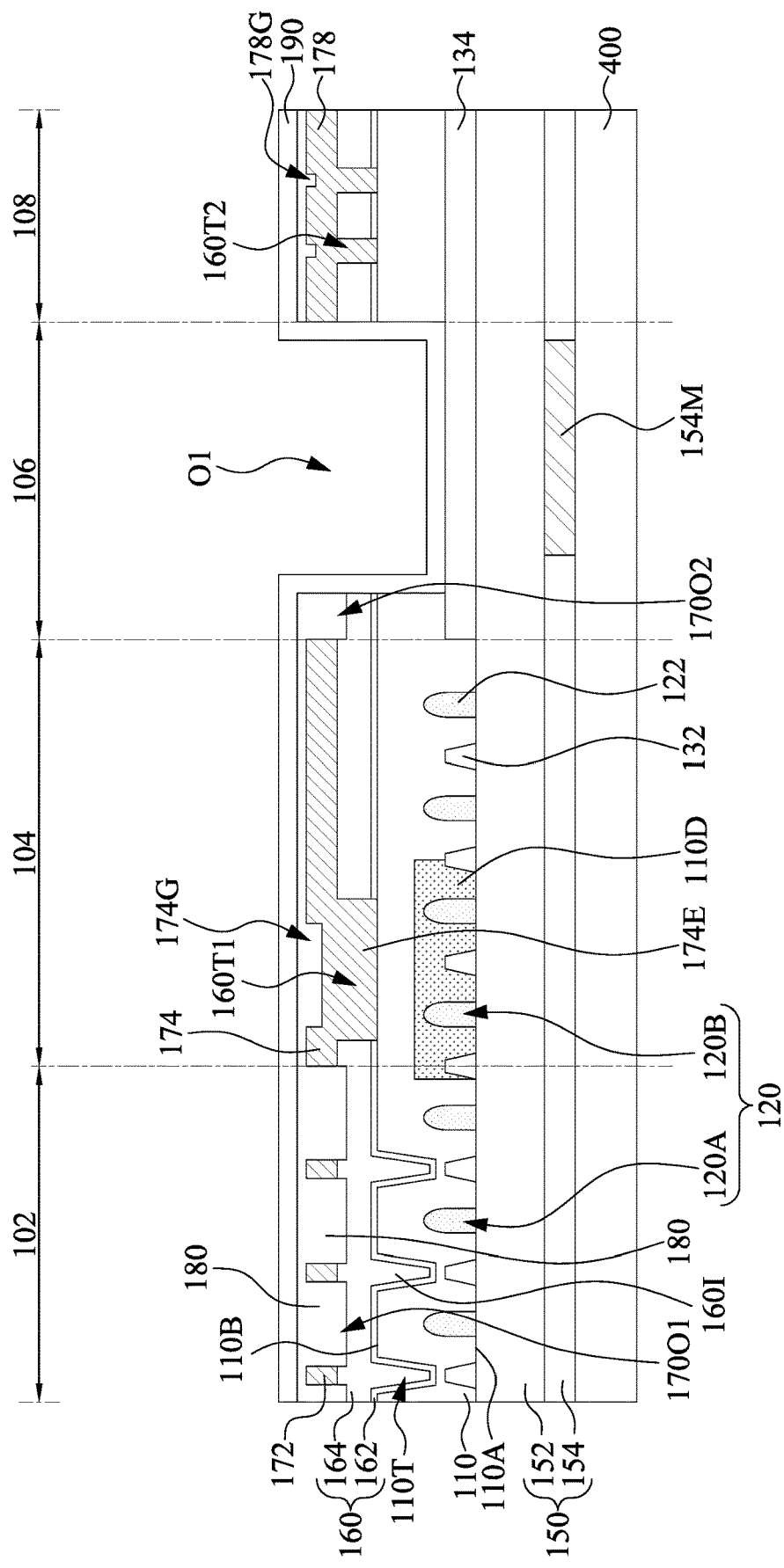

Reference is made to FIG. 26. An etching process is performed to remove a portion of the dielectric layer 180, a portion of the dielectric layer 160, and a portion of the substrate 110 in the scribe line region 106, thereby forming opening O1 in the scribe line region 106. The opening O1 extends from the back surface 110B of the substrate 110 toward the front surface 110A of the substrate 110. Subsequently, a buffer oxide layer 190 is formed over a remaining portion of the dielectric layer 180 in the regions 102, 104, and 108, and extends into the opening O1 in the scribe line region 106.

Figure 27:
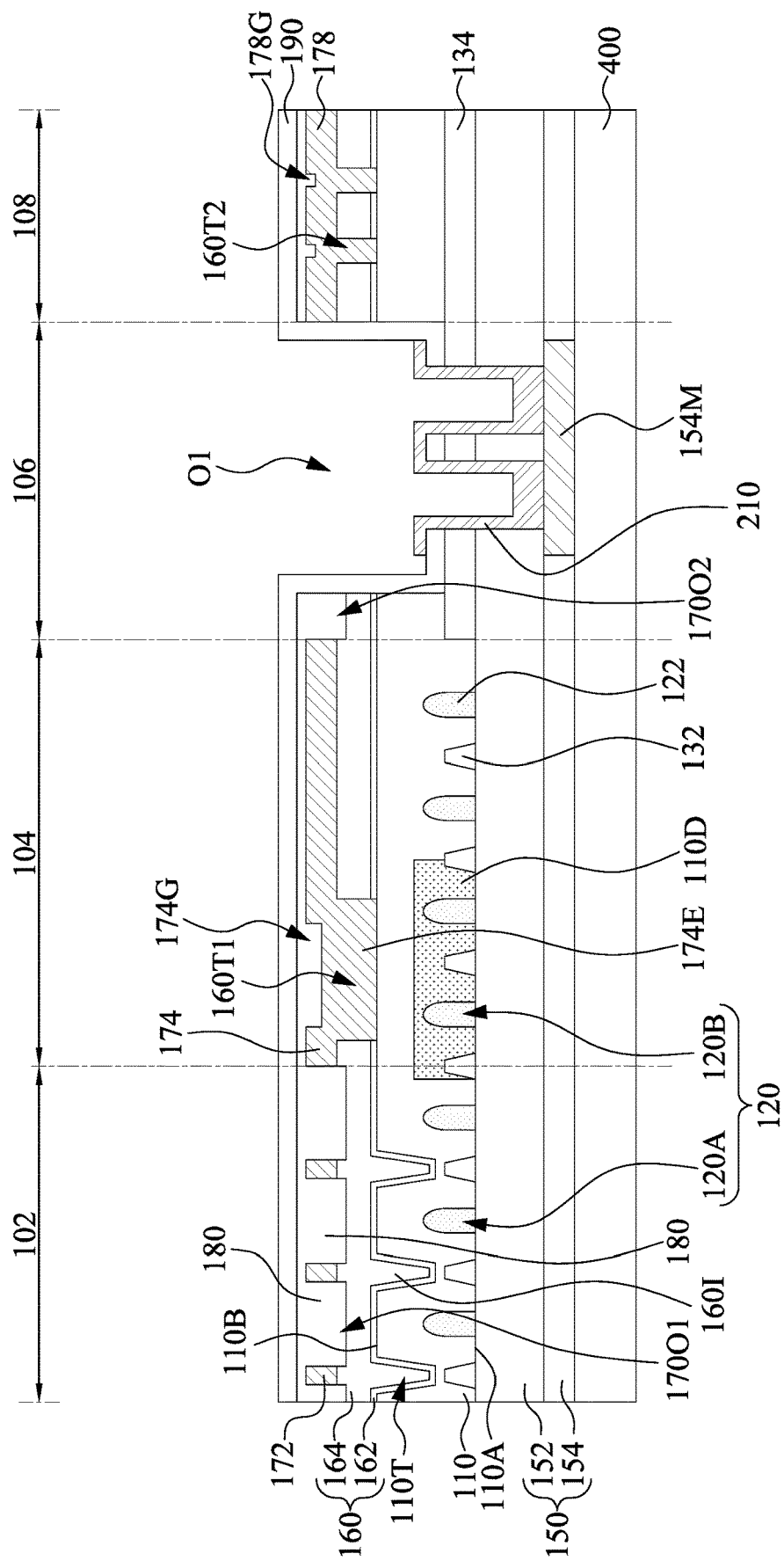

Reference is made to FIG. 27. The buffer oxide layer 190 and the underlying dielectric materials (e.g., the isolation layer 134 and the ILD layer 152) in the scribe line region 106 are patterned to expose the conductive lines 154M of the interconnect structure 150. Subsequently, a bonding pad 210 is formed on the interconnect structure 150 in a manner so that the bonding pad 210 is electrically coupled to the exposed conductive features 154M and separated from the sidewall of the substrate 110 by the buffer oxide layer 190. The bonding pad 210 is used for forming an electrical connection, such as a wire bonding (not shown), to electrically couple to the circuits and the photosensitive pixels 120. The bonding pad 210 may be coupled to the photosensitive pixels 120 through interconnect structure 150.

Figure 28:
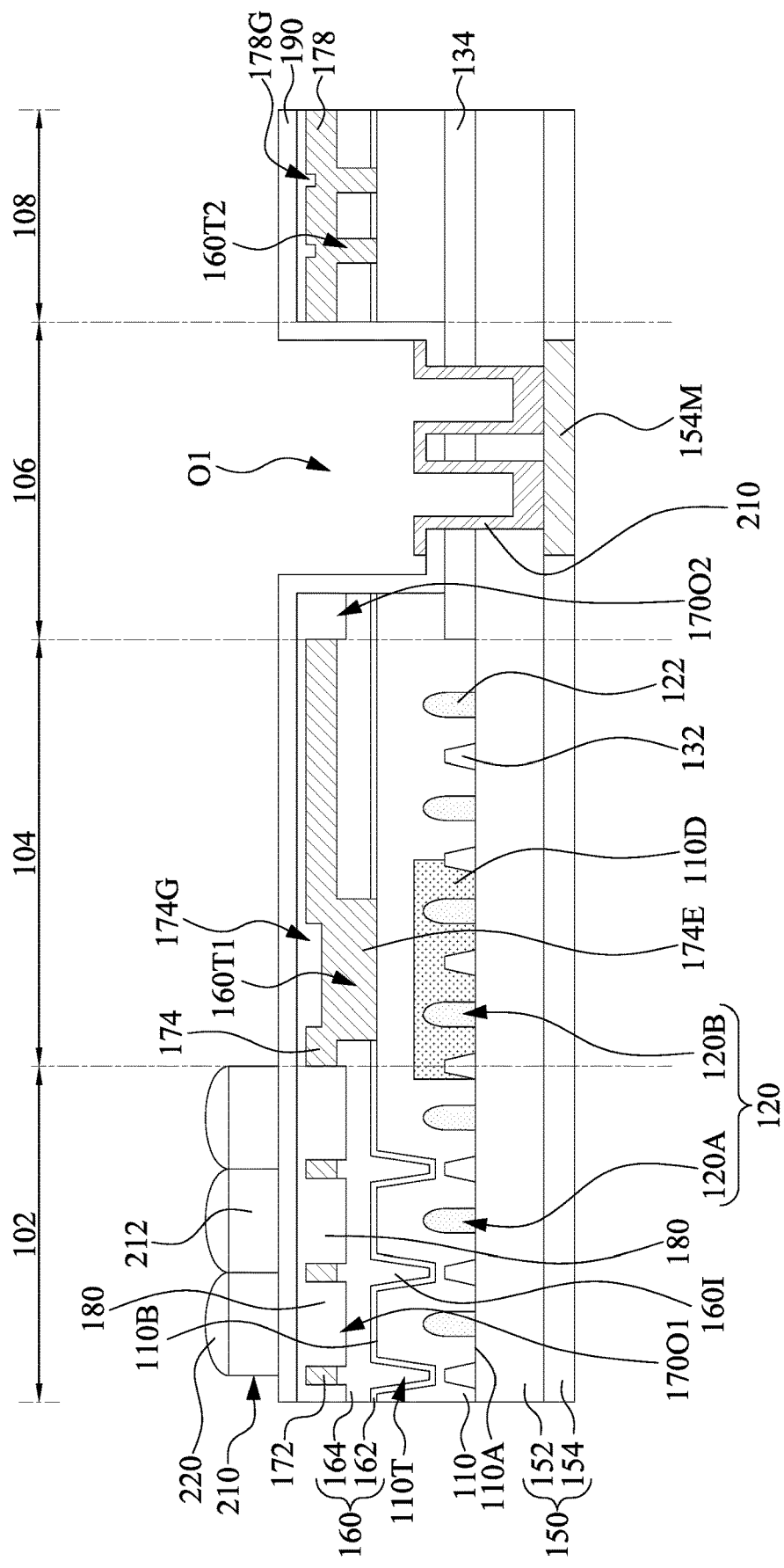

Reference is made to FIG. 28. A color filter layer 210 may be formed over the dielectric layer 180 in the pixel array region 102. In some embodiments, the color filter layer 210 includes plural color filters 212, aligned with respective active photosensitive pixels 120A. In some embodiments, an array of micro-lenses 220 is formed over the color filter layer 210 and aligned with respective color filters 212 and respective active photosensitive pixels 120A. In some embodiments, after forming the micro-lenses 220, the carrier substrate 400 (referring to FIG. 27) may be de-bonded form the image sensor device 100 and the image sensor device 100 may undergo further processing such as, for example, packaging. Other details regarding the formation of the color filter layer 210 and the micro-lenses 220 are discussed previously with respect to FIG. 16, and not repeated herein.

Figure 29:
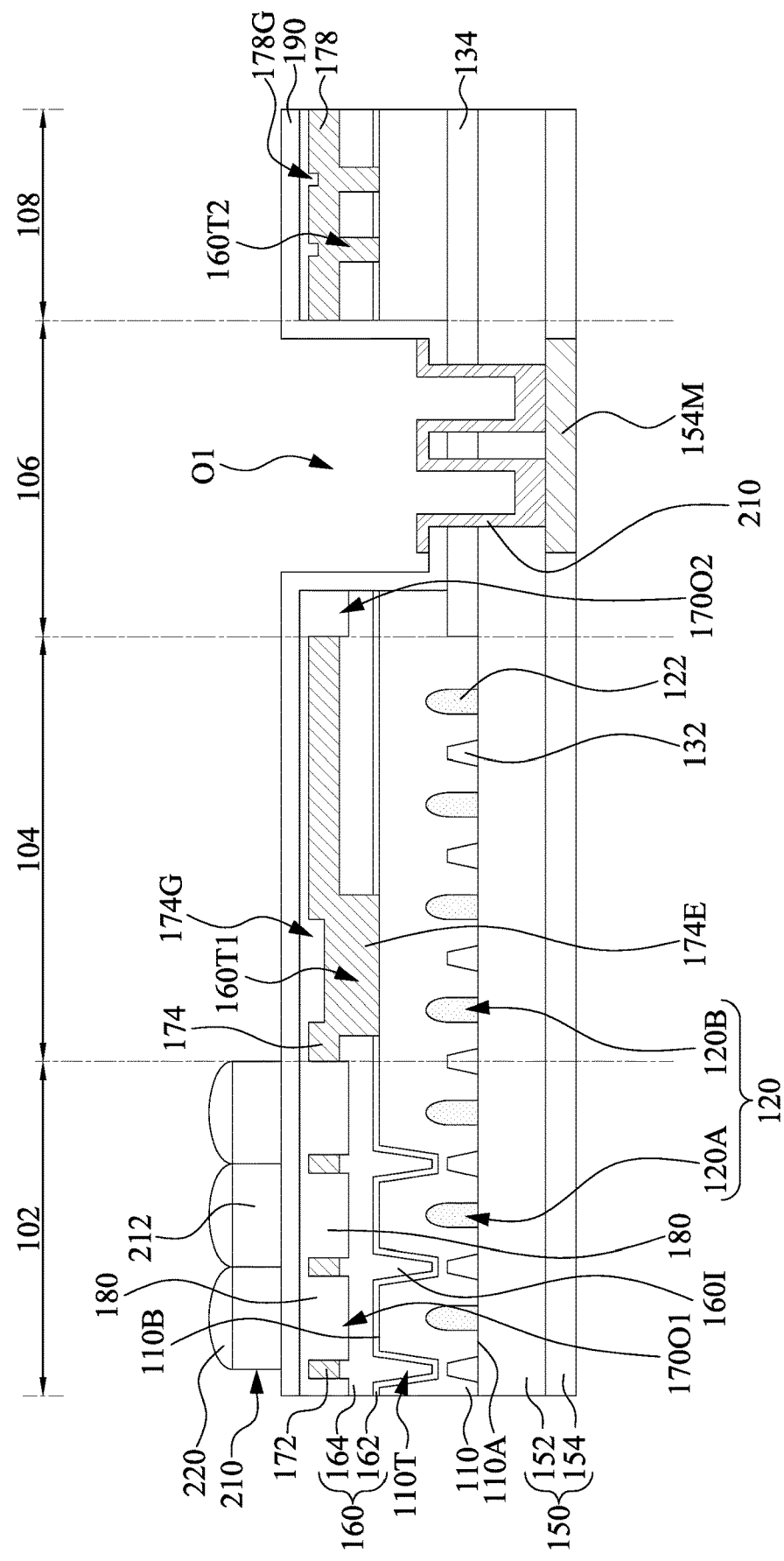
FIG. 29 is a schematic cross-sectional view of an image sensor device according to some embodiments of the present disclosure.

FIG. 29 is a schematic cross-sectional view of an image sensor device according to some embodiments of the present disclosure. The present embodiments are similar to the embodiments of FIG. 16 and FIG. 27, except that the doped region 110D (referring to FIG. 16) is omitted in the substrate 110. In some embodiments, the image sensor device of FIG. 29 can be formed using the process flow illustrated in FIGS. 5-16 while skipping the step shown in FIG. 7. In some other embodiments, the image sensor device of FIG. 29 can be formed using the process flow illustrated in FIGS. 17-28 while skipping the ion implantation step of doped region 110D as shown in FIG. 7. Other details of the present embodiments are similar to those discussed previously with respect to FIGS. 5-28, and therefore not repeated herein for the sake of brevity.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the elongated metal structure in the BLC region can prevent light from laterally propagating from the pixel array region toward the BLC region. Another advantage is that the elongated metal structure may laterally surround or encircle the entire pixel array region, which in turn improves the light blocking ability. Still another advantage is that the elongated metal structure may be in contact with the substrate, thus grounding the elongated metal structure and a metal grid extending from the elongated metal structure. Still another advantage is that an additional doped region is formed in the substrate and runs in parallel with the elongated metal structure, which in turn reduces the electrical leakage caused by the substrate's damages resulting from the etching process of forming the trench that is used to receive the elongated metal structure.

According to some embodiments of the present disclosure, a method for fabricating an image sensor device is provided. The method includes forming a plurality of photosensitive pixels in a substrate; depositing a dielectric layer over the substrate; etching the dielectric layer, resulting in a first trench in the dielectric layer and laterally surrounding the photosensitive pixels; and forming a light blocking structure in the first trench, such that the light blocking structure laterally surrounds the photosensitive pixels.

According to some embodiments of the present disclosure, a method for fabricating an image sensor device is provided. The method includes forming a plurality of photosensitive regions in a substrate through a front surface of the substrate; forming a doped region in the substrate and laterally surrounding the photosensitive regions of the substrate; depositing a dielectric layer over a back surface of the substrate opposite the front surface of the substrate; etching the dielectric layer, resulting in a first trench overlapping the doped region; and forming a light blocking structure in the first trench.

According to some embodiments of the present disclosure, an image sensor device includes a substrate, plural photosensitive pixels, an interconnect structure, a dielectric layer, and a light blocking element. The photosensitive pixels are in the substrate. The interconnect structure is over a first side of the substrate. The dielectric layer is over a second side of the substrate opposite the first side of the substrate. The light blocking element has a first portion extending over a top surface of the dielectric layer and a second portion extending in the dielectric layer, in which the second portion of the light blocking element laterally surrounds the photosensitive pixels.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an image sensor device, comprising:

forming a plurality of photosensitive pixels in a substrate and a plurality of reference photosensitive pixels around the photosensitive pixels;

depositing a dielectric layer over the substrate;

etching the dielectric layer, resulting in a first trench in the dielectric layer and laterally surrounding the photosensitive pixels; and forming a light blocking structure in the first trench, such that the light blocking structure laterally surrounds the photosensitive pixels, and such that a bottommost surface of the light blocking structure is in contact with the substrate and overlaps the reference photosensitive pixels from a top view.

2. The method of claim 1, wherein etching the dielectric layer exposes a portion of the substrate in the first trench.

3. The method of claim 1, wherein forming the light blocking structure comprises:

depositing a metal layer over the dielectric layer and in the first trench; and patterning the metal layer to form the light blocking structure.

4. The method of claim 3, wherein patterning the metal layer forms a metal grid over the photosensitive pixels.

5. The method of claim 4, wherein patterning the metal layer is performed such that the bottommost surface of the light blocking structure is lower than a bottom surface of the metal grid.

6. The method of claim 1, further comprising:

forming a doped region in the substrate and running in parallel with the first trench from the top view, the doped region and the substrate being of opposite conductivity types.

7. The method of claim 6, wherein forming the light blocking structure is performed such that the light blocking structure is in contact with the doped region.

8. The method of claim 6, wherein forming the light blocking structure is performed such that the light blocking structure is spaced apart from the doped region.

9. The method of claim 1, further comprising:

etching a second trench in the substrate prior to depositing the dielectric layer, wherein depositing the dielectric layer is performed such that the dielectric layer overfills the second trench in the substrate.

10. A method for fabricating an image sensor device, comprising:

forming a plurality of photosensitive regions and a plurality of reference photosensitive regions in a substrate through a front surface of the substrate;

forming a doped region in the substrate and laterally surrounding the photosensitive regions of the substrate, wherein the doped region overlaps the reference photosensitive regions from a top view, and a dopant concentration of the doped region is higher or lower than a dopant concentration of the photosensitive regions and the reference photosensitive regions;

depositing a dielectric layer over a back surface of the substrate opposite the front surface of the substrate;

etching the dielectric layer, resulting in a first trench overlapping the doped region; and forming a light blocking structure in the first trench.

11. The method of claim 10, wherein etching the dielectric layer results in the first trench running in parallel with the doped region.

12. The method of claim 10, wherein the doped region is formed by performing ion implantation on the back surface of the substrate.

13. The method of claim 10, wherein the doped region is formed by performing ion implantation on the front surface of the substrate.

14. The method of claim 10, wherein etching the dielectric layer exposes the doped region in the substrate.

15. The method of claim 10, wherein the doped region and the substrate are of opposite conductivity types.

16. A method for fabricating an image sensor device, comprising:

forming a plurality of photosensitive pixels in a pixel array region of a substrate;

forming a plurality of reference photosensitive pixels in a black level correction region of the substrate, wherein the black level correction region surrounds the pixel array region;

forming an interconnect structure over a first side of the substrate;

depositing a dielectric layer over a second side of the substrate opposite the first side of the substrate; and forming a light blocking element having a first portion extending over a top surface of the dielectric layer and a second portion extending in the dielectric layer, wherein the first portion of the light blocking element covers the black level correction region of the substrate, and a bottommost surface of the second portion of the light blocking element is below the top surface of the dielectric layer and above the reference photosensitive pixels, wherein the second portion of the light blocking element is between the photosensitive pixels and at least a portion of the reference photosensitive pixels from a top view.

17. The method of claim 16, further comprising:

forming a grid structure over the top surface of the dielectric layer, wherein the grid structure extends from the first portion of the light blocking element to over the photosensitive pixels.

18. The method of claim 16, further comprising:

forming a doped region in the substrate and extending in parallel with the second portion of the light blocking element from the top view.

19. The method of claim 16, wherein the bottommost surface of the second portion of the light blocking element is in contact with the second side of the substrate.

20. The method of claim 16, wherein a width of the second portion of the light blocking element is greater than a width of the photosensitive pixels.

* * * * *